(12) United States Patent
Takahashi et al.

(10) Patent No.: US 12,218,171 B2
(45) Date of Patent: Feb. 4, 2025

(54) LOW-NOISE IMAGE SENSOR HAVING STACKED SEMICONDUCTOR SUBSTRATES

(71) Applicant: Taiwan Semiconductor Manufacturing Company, Ltd., Hsin-Chu (TW)

(72) Inventors: Seiji Takahashi, Hsinchu (TW); Jhy-Jyi Sze, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 198 days.

(21) Appl. No.: 17/854,590

(22) Filed: Jun. 30, 2022

(65) Prior Publication Data

US 2022/0336515 A1    Oct. 20, 2022

Related U.S. Application Data

(62) Division of application No. 16/526,030, filed on Jul. 30, 2019, now Pat. No. 11,482,556.

(Continued)

(51) Int. Cl.
*H01L 27/146*    (2006.01)

(52) U.S. Cl.
CPC .. *H01L 27/14636* (2013.01); *H01L 27/14603* (2013.01); *H01L 27/14612* (2013.01);
(Continued)

(58) Field of Classification Search
CPC ........... H01L 27/16434; H01L 27/1469; H01L 27/14636; H01L 27/14603;
(Continued)

(56) References Cited

U.S. PATENT DOCUMENTS

| 2011/0049336 A1 | 3/2011 | Matsunuma |
| 2014/0042445 A1* | 2/2014 | Kao ..................... H01L 27/1464<br>257/E31.043 |

(Continued)

OTHER PUBLICATIONS

Non-Final Office Action dated Jun. 15, 2021 for U.S. Appl. No. 16/526,030.

(Continued)

*Primary Examiner* — Joshua Benitez Rosario
*Assistant Examiner* — John Lin
(74) *Attorney, Agent, or Firm* — Eschweiler & Potashnik, LLC

(57) ABSTRACT

Various embodiments of the present disclosure are directed towards an image sensor. The image sensor includes a first semiconductor substrate having a photodetector and a floating diffusion node. A transfer gate is disposed over the first semiconductor substrate, where the transfer gate is at least partially disposed between opposite sides of the photodetector. A second semiconductor substrate is vertically spaced from the first semiconductor substrate, where the second semiconductor substrate comprises a first surface and a second surface opposite the first surface. A readout transistor is disposed on the second semiconductor substrate, where the second surface is disposed between the transfer gate and a gate of the readout transistor. A first conductive contact is electrically coupled to the transfer gate and extending vertically from the transfer gate through both the first surface and the second surface.

20 Claims, 23 Drawing Sheets

Related U.S. Application Data

(60) Provisional application No. 62/806,455, filed on Feb. 15, 2019.

(52) U.S. Cl.
CPC .. *H01L 27/14616* (2013.01); *H01L 27/14634* (2013.01); *H01L 27/14641* (2013.01); *H01L 27/14689* (2013.01); *H01L 27/1469* (2013.01)

(58) Field of Classification Search
CPC ......... H01L 27/14616; H01L 27/14689; H01L 27/14643; H01L 27/1463; H01L 27/146
See application file for complete search history.

(56) References Cited

U.S. PATENT DOCUMENTS

| | | |
|---|---|---|
| 2015/0295007 A1 | 10/2015 | Cellek et al. |
| 2016/0086984 A1 | 3/2016 | Wang et al. |
| 2017/0243903 A1 | 8/2017 | Ting et al. |
| 2019/0115387 A1 | 4/2019 | Yamagishi et al. |
| 2019/0131336 A1 | 5/2019 | Yoon et al. |
| 2021/0084249 A1* | 3/2021 | Nakazawa ........ H01L 27/14634 |

OTHER PUBLICATIONS

Final Office Action dated Dec. 9, 2021 for U.S. Appl. No. 16/526,030.
Notice of Allowance dated Jun. 23, 2022 for U.S. Appl. No. 16/526,030.

* cited by examiner

LOW-NOISE IMAGE SENSOR HAVING STACKED SEMICONDUCTOR SUBSTRATES

REFERENCE TO RELATED APPLICATIONS

This application is a Divisional of U.S. application Ser. No. 16/526,030, filed on Jul. 30, 2019, which claims the benefit of U.S. Provisional Application No. 62/806,455, filed on Feb. 15, 2019. The contents of the above-referenced patent applications are hereby incorporated by reference in their entirety.

BACKGROUND

Many modern day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors. Compared to CCD pixel sensors, CMOS pixel sensors are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
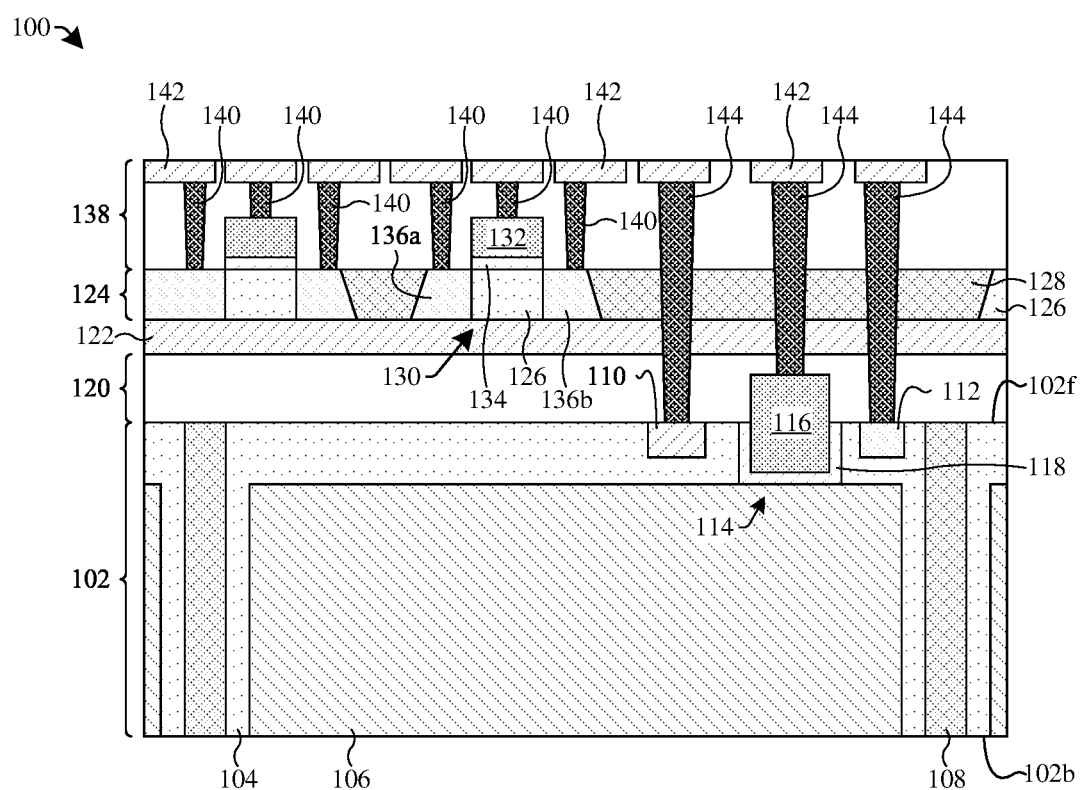
FIG. 1 illustrates a cross-sectional view of some embodiments of a low-noise image sensor having stacked semiconductor substrates.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide semiconductor image sensors (CISs) have an array of pixel sensors. A pixel sensor of the array of pixel sensors comprises an array of photodetectors (e.g., a 2×2 photodetector array) disposed in a semiconductor substrate. In some embodiments, the photodetectors may be separated from one another by an isolation structure (e.g., a full-depth isolation structure). Further, the pixel sensor comprises a plurality of pixel devices (e.g., a transfer gate, a reset transistor, a source follower transistor, and/or a row-select transistor) that are disposed on an active region of the semiconductor substrate. An interconnect structure overlies the semiconductor substrate and the pixel devices, and electrically couples the photodetectors and the pixel devices together, such that the pixel sensor may function properly. The pixel sensor records incident radiation (e.g., photons) using the photodetectors and facilitates digital readout of the recording with the pixel devices.

One challenge with the above CISs is poor noise performance (e.g., random noise, fixed-pattern noise, flicker noise, shot noise, thermal noise, white noise, etc.). One contributor to noise performance is sizes of the plurality of pixel devices (e.g., a size of the source follower device). While the isolation structure may improve full well capacity of the image sensor, the isolation structure may reduce a size of the active region of the semiconductor substrate. Because the isolation structure reduces the size of the active region, the sizes of the pixel devices are typically reduced in order for the pixel devices, the isolation structure, and the photodetectors to be disposed on/in the semiconductor substrate. However, reducing the sizes of the pixel devices negatively affects noise (e.g., due to a size of the source follower device being reduced), thereby contributing to poor noise performance.

Another contributor to noise is a total conductive area of the interconnect structure (e.g., due to an increase in parasitic capacitance). For example, the total conductive area of metal lines, metal vias, and metal contacts disposed over the semiconductor substrate to electrically couple the pixel devices and the photodetectors together. Typically, the location of the pixel devices are at least partially dependent upon the layout of the isolation structure and/or the photodetectors, thereby causing some pixel devices to be disposed a relatively large distance from other pixel devices and/or some of the photodetectors. Thus, some metal lines may extend a relatively large distance in order to electrically couple the some of the pixel devices to the other pixel devices and/or the some of the photodetectors. Accordingly, the total conductive area of the interconnect structure is increased, thereby contributing to poor noise performance.

Various embodiments of the present application are directed toward a low-noise image sensor. The low-noise image sensor includes a photodetector and floating diffusion node disposed in a first semiconductor substrate. A transfer gate is disposed on the first semiconductor substrate. In some embodiments, an isolation structure is disposed in the first semiconductor substrate. A second semiconductor substrate is spaced from the first semiconductor substrate. A readout transistor (e.g., a source follower transistor) is disposed on the second semiconductor substrate, wherein a surface of the second semiconductor substrate is disposed between the transfer gate and a gate of the readout transistor. A conductive contact is electrically coupled to the transfer gate and extends vertically from the transfer gate to the second semiconductor substrate.

Because the second semiconductor substrate is vertically spaced from the first semiconductor substrate, and because the isolation structure is disposed in the first semiconductor substrate and the readout transistor is disposed on the second semiconductor substrate, the isolation structure may not constrain a size of the readout transistor. Thus, the size of the readout transistor may be larger than if the readout transistor and the isolation structure were disposed on a same semiconductor substrate. Accordingly, the low-noise image sensor may have improved noise performance (e.g., due to an increased size of the source follower transistor).

In addition, because the photodetector, the transfer gate, and the floating diffusion node are disposed in/over a different semiconductor substrate than the readout transistor, the readout transistor may be disposed closer to the floating diffusion node than if the readout transistor and the floating diffusion node were disposed on a same semiconductor substrate. Thus, a total conductive area of an interconnect structure may be less than if both the readout transistor and the floating diffusion node were disposed on the same semiconductor substrate. Accordingly, the low-noise image sensor may have improved noise performance (e.g., due to a reduction in total conductive area of an interconnect structure).

FIG. 1 illustrates a cross-sectional view of some embodiments of a low-noise image sensor 100 having stacked semiconductor substrates.

As shown in FIG. 1, the low-noise image sensor 100 comprises a first semiconductor substrate 102. The first semiconductor substrate 102 has a front-side 102f and a back-side 102b. The first semiconductor substrate 102 comprises a first doped region 104 having a first doping type (e.g., p-type/n-type). A photodetector 106 (e.g., a photodiode) is disposed in the first semiconductor substrate 102. The photodetector 106 is configured to absorb incident radiation (e.g., photons) and generate electrical signals corresponding to the incident radiation. A first isolation structure 108 is disposed in the first semiconductor substrate 102 and laterally surrounds the photodetector 106.

A pickup well contact region 110 is disposed in the first doped region 104. The pickup well contact region 110 is a region of the first semiconductor substrate 102 having the first doping type. A floating diffusion node 112 is disposed in the first semiconductor substrate 102 and laterally spaced from the pickup well contact region 110. The floating diffusion node 112 is a region of the first semiconductor substrate 102 having a second doping type (e.g., n-type/p-type) opposite the first doping type.

A transfer gate 114 is disposed in/over the first semiconductor substrate 102 and between opposite sides of the photodetector 106. The transfer gate 114 comprises a transfer gate electrode 116 and a transfer gate dielectric 118. The transfer gate 114 is configured to selectively form a conductive channel between the photodetector 106 and the floating diffusion node 112, such that charge accumulated (e.g., via absorbing incident radiation) in the photodetector 106 may be transferred to the floating diffusion node 112.

A first interlayer dielectric (ILD) structure 120 is disposed over the first semiconductor substrate 102 and the transfer gate 114. In some embodiments, the front-side 102f of the first semiconductor substrate 102 is the side of the first semiconductor substrate 102 disposed nearest the first ILD structure 120, and the back-side 102b of the first semiconductor substrate 102 is the side of the first semiconductor substrate 102 opposite the front-side 102f. In further embodiments, a bonding structure 122 is disposed over the first ILD structure 120.

A second semiconductor substrate 124 is vertically spaced from the first semiconductor substrate 102 and disposed over the first ILD structure 120. The second semiconductor substrate 124 comprises an active region 126. In some embodiments, the active region 126 comprises the first doping type. In other embodiments, the active region 126 may be undoped. In embodiments in which the active region 126 comprises the first doping type, the active region 126 may be referred to as a second doped region. A second isolation structure 128 is disposed in the second semiconductor substrate 124.

A readout transistor 130 (e.g., reset transistor, source follower transistor, row-select transistor, etc.) is disposed on the second semiconductor substrate 124. In some embodiments, the readout transistor 130 comprises a readout gate electrode 132 and a readout gate dielectric 134 that are disposed over the second semiconductor substrate 124. In some embodiments, the readout gate electrode 132 and the readout gate dielectric 134 are referred to a readout transistor gate. The readout gate dielectric 134 separates the readout gate electrode 132 from the second semiconductor substrate 124. In further embodiments, the readout transistor 130 comprises a first pair of source/drain regions 136a-b disposed in the second semiconductor substrate 124 and on opposite sides of the readout gate dielectric 134. In yet further embodiments, the readout transistor 130 may be, for example, a metal-oxide semiconductor field-effect transistor (MOSFET), a bipolar junction transistor (BJT), a high-electron-mobility transistor (HEMTs), or the like.

A second ILD structure 138 is disposed over the second semiconductor substrate 124 and the readout gate electrode 132. A plurality of first conductive contacts 140 (e.g., metal contacts) are disposed in the second ILD structure 138 and over the second semiconductor substrate 124. A plurality of first conductive lines 142 (e.g., metal lines) are disposed in the second ILD structure 138 and over the first conductive contacts 140. The first conductive contacts 140 provide electrical connections between the readout transistor 130 and some of the first conductive lines 142, respectively.

A plurality of second conductive contacts 144 are disposed over the first semiconductor substrate 102 and extend vertically through the first ILD structure 120 to the second semiconductor substrate 124. The second conductive contacts 144 are electrically coupled to the pickup well contact region 110, the floating diffusion node 112, and the transfer gate electrode 116, respectively. In some embodiments, at least one of the second conductive contacts 144 at least partially provides a conductive path between the pickup well contact region 110, the floating diffusion node 112, or the transfer gate electrode 116 and the readout transistor 130. For example, one of the second conductive contacts 144 may at least partially define a conductive path between the floating diffusion node 112 and a first source/drain region 136a.

In some embodiments, the second conductive contacts 144 extend vertically through the second semiconductor substrate 124 and into the second ILD structure 138. The second conductive contacts 144 may extend vertically through the second isolation structure 128 and into the second ILD structure 138. In further embodiments, each of the second conductive contacts 144 are electrically coupled to one or more of the first conductive lines 142. In yet further embodiments, the second conductive contacts 144, the first conductive contacts 140, and the first conductive lines 142 may at least partially define a first interconnect structure.

Because the second semiconductor substrate 124 is vertically spaced from the first semiconductor substrate 102, and because the first isolation structure 108 is disposed in the first semiconductor substrate 102 and the readout transistor 130 is disposed on the second semiconductor substrate 124, the first isolation structure 108 may not constrain a size of the readout transistor 130 (e.g., a size of the readout gate electrode 132, the readout gate dielectric 134, and/or the first pair of source/drain regions 136a-b). Thus, the size of the readout transistor 130 may be larger than if both the readout transistor 130 and the first isolation structure 108 were disposed on a same semiconductor substrate (e.g., the first semiconductor substrate 102). Accordingly, the low-noise image sensor 100 may have improved noise performance.

In addition, because the photodetector 106, the transfer gate 114, and the floating diffusion node 112 are disposed in/over the first semiconductor substrate 102 and the readout transistor 130 is disposed on the second semiconductor substrate 124, the readout transistor 130 may be disposed closer to the floating diffusion node 112 than if both the readout transistor 130 and the floating diffusion node 112 were disposed on a same semiconductor substrate (e.g., the first semiconductor substrate 102). Thus, a total conductive area of the first interconnect structure (e.g., the second conductive contacts 144, the first conductive contacts 140, and the first conductive lines 142) may be less than if both the readout transistor 130 and the floating diffusion node 112 were disposed on the same semiconductor substrate. Accordingly, the low-noise image sensor 100 may have improved noise performance.

Figure 2:
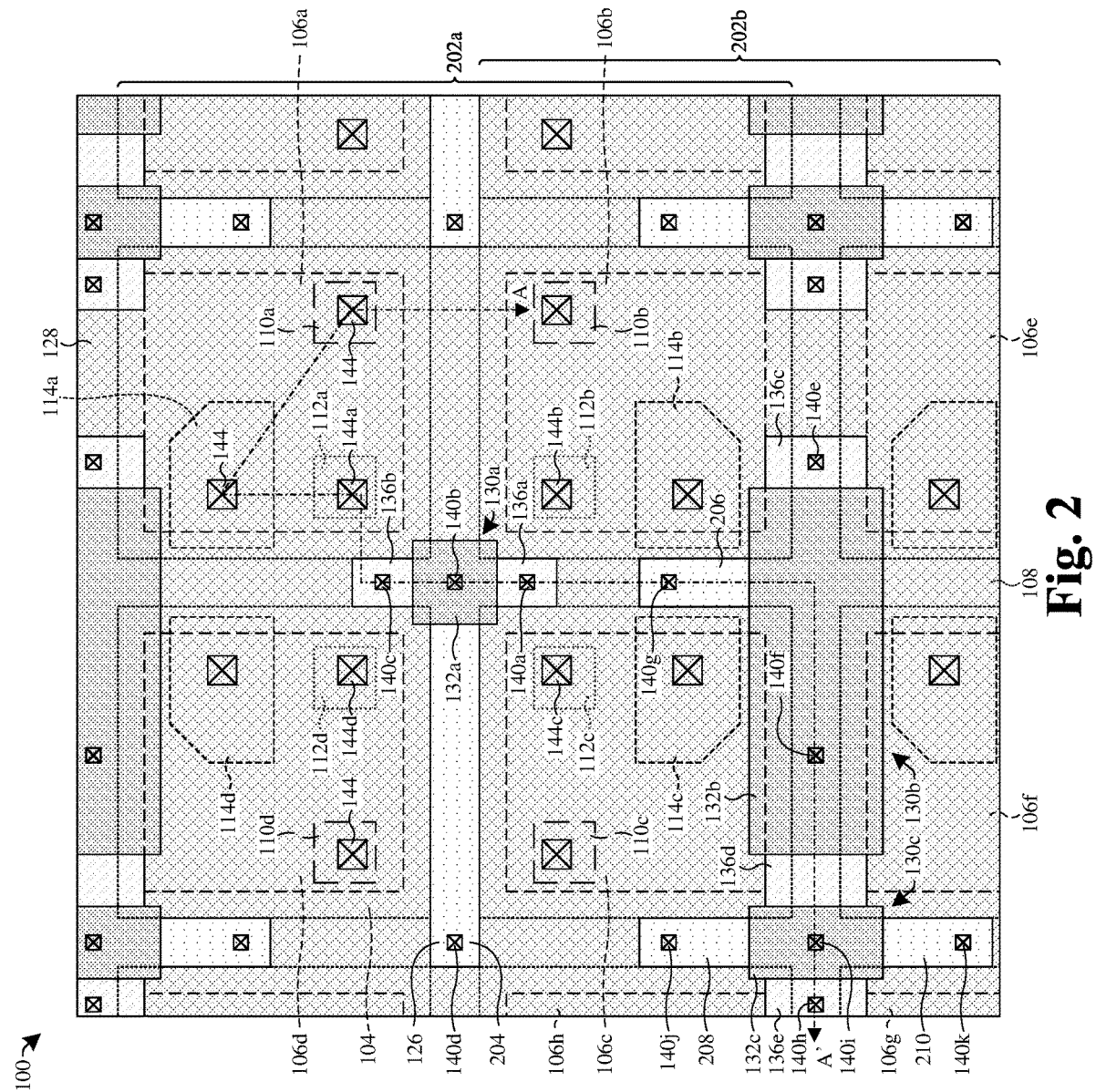
FIG. 2 illustrates a layout view of some other embodiments of the low-noise image sensor of FIG. 1.

FIG. 2 illustrates a layout view of some other embodiments of the low-noise image sensor 100 of FIG. 1. FIG. 2 illustrates the low-noise image sensor 100 without the second ILD structure 138 and the first conductive lines 142. Further, for clarity in FIG. 2, features disposed beneath the second semiconductor substrate 124 (e.g., transfer gate 114, photodetector 106, first isolation structure 108, floating diffusion node 112) are illustrated in phantom by various dashed lines. In addition, for clarity in FIG. 2, the first conductive contacts 140 and the second conductive contacts 144 are illustrated by an "X" disposed in a box. Moreover, for clarity in FIG. 2, the second conductive contacts 144 are illustrated by a larger "X" and corresponding larger box than the first conductive contacts 140.

As shown in FIG. 2, the low-noise image sensor 100 comprises a plurality of photodetectors 106a-h disposed in the first semiconductor substrate 102. The plurality of photodetectors 106a-h may comprise a first plurality of the photodetectors 106a-d, a second plurality of the photodetectors 106b,c,e,f, and a third plurality of the photodetectors 106c,f,g,h. For example, the first plurality of the photodetectors 106a-d comprises a first photodetector 106a, a second photodetector 106b, a third photodetector 106c, and a fourth photodetector 106d. The second plurality of the photodetectors 106b,c,e,f may comprise the second photodetector 106b, the third photodetector 106c, a fifth photodetector 106e, and a sixth photodetector 106f. The third plurality of the photodetectors 106c,f,g,h may comprise the third photodetector 106c, the sixth photodetector 106f, a seventh photodetector 106g, and an eighth photodetector 106h.

In some embodiments, the photodetectors of each of the plurality of the photodetectors are disposed in an array having a plurality of rows and columns (e.g., a 2×2 array). For example, the first photodetector 106a, the second photodetector 106b, the third photodetector 106c, and the fourth photodetector 106d are disposed in a first array 202a. The second photodetector 106b, the third photodetector 106c, the fifth photodetector 106e, and the sixth photodetector 106f may be disposed in a second array 202b.

In some embodiments, the first plurality of the photodetectors 106a-d, the second plurality of the photodetectors 106b,c,e,f, and/or the third plurality of the photodetectors 106c,f,g,h may share one or more of the plurality of photodetectors 106a-h. For example, the first plurality of the photodetectors 106a-d, the second plurality of the photodetectors 106b,c,e,f, and the third plurality of the photodetectors 106c,f,g,h each comprise the third photodetector 106c. In other embodiments, the first plurality of the photodetectors 106a-d, the second plurality of the photodetectors 106b,c,e,f, and/or the third plurality of the photodetectors 106c,f,g,h may each have discrete photodetectors.

A plurality of pickup well contact regions 110a-d are disposed in the first semiconductor substrate 102. The pickup well contact regions 110a-d correspond to the first plurality of the photodetectors 106a-d, respectively. For example, a first pickup well contact region 110a corresponds to the first photodetector 106a, a second pickup well contact region 110b corresponds to the second photodetector 106b, a third pickup well contact region 110c corresponds to the third photodetector 106c, and a fourth pickup well contact region 110d corresponds to the fourth photodetector 106d.

A plurality of floating diffusion nodes 112a-d are disposed in the first semiconductor substrate 102. The floating diffusion nodes 112a-d correspond to the first plurality of the photodetectors 106a-d, respectively. For example, a first floating diffusion node 112a corresponds to the first photodetector 106a, a second floating diffusion node 112b corresponds to the second photodetector 106b, a third floating diffusion node 112c corresponds to the third photodetector 106c, and a fourth floating diffusion node 112d corresponds to the fourth photodetector 106d.

A plurality of transfer gates 114a-d are disposed in/over the first semiconductor substrate 102. The transfer gates 114a-d correspond to the first plurality of the photodetectors 106a-d, respectively. For example, a first transfer gate 114a corresponds to the first photodetector 106a, a second transfer gate 114b corresponds to the second photodetector 106b, a third transfer gate 114c corresponds to the third photodetector 106c, and a fourth transfer gate 114d corresponds to the fourth photodetector 106d. It will be appreciated that each of the transfer gates 114a-d comprise a transfer gate electrode 116 disposed on a transfer gate dielectric 118.

Each of the second conductive contacts 144 are electrically coupled to one of the pickup well contact regions 110a-d, one of the floating diffusion nodes 112a-d, or one of the transfer gates 114a-d. For example, a first one of the second conductive contacts 144 (hereinafter "first conductive contact 144a") is electrically coupled to the first floating diffusion node 112a, a second one of the second conductive contacts 144 (hereinafter "second conductive contact 144b") is electrically coupled to the second floating diffusion node 112b, a third one of the second conductive contacts 144 (hereinafter "third conductive contact 144c") is electrically coupled to the third floating diffusion node 112c, and a fourth one of the second conductive contacts 144 (hereinafter "fourth conductive contact 144d") is electrically coupled to the fourth floating diffusion node 112d. In some embodiments, each of the second conductive contacts 144 that are electrically coupled to one of the pickup well contact regions 110a-d are configured to provide an electrical connection between the pickup well contact regions 110a-d and ground (e.g., about 0 Volts (V)).

A plurality of readout transistors 130a-c are disposed on the second semiconductor substrate 124. For example, a first readout transistor 130a, a second readout transistor 130b, and a third readout transistor 130c are disposed on the second semiconductor substrate 124. A plurality of readout gate electrodes 132a-c are disposed over the second semiconductor substrate 124. The readout transistors 130a-c comprise the readout gate electrodes 132a-c, respectively. A plurality of readout gate dielectrics 134a-c (not shown in FIG. 2) separate the readout gate electrodes 132a-c from the second semiconductor substrate 124. For example, the first readout transistor 130a comprises a first readout gate electrode 132a and a first readout gate dielectric 134a, the second readout transistor 130b comprises a second readout gate electrode 132b and a second readout gate dielectric 134b, the third readout transistor 130c comprises a third readout gate electrode 132c and a third readout gate dielectric 134c.

A plurality of source/drain regions 136 are disposed in the second semiconductor substrate 124. The source/drain regions 136 are regions of the second semiconductor substrate 124 having the second doping type. Each of the readout transistors 130a-c comprise a pair of the source/drain regions 136. For example, the first readout transistor 130a comprises the first pair of source/drain regions 136a-b disposed on opposite sides of the first readout gate electrode 132a, the second readout transistor 130b comprises a second pair of source/drain regions 136c-d disposed on opposite sides of the second readout gate electrode 132b, and the third readout transistor 130c comprises a third pair of source/drain regions 136d-e disposed on opposite sides of the third readout gate electrode 132c. The first pair of source/drain regions 136a-b comprises the first source/drain region 136a and a second source/drain region 136b.

In some embodiments, the second pair of source/drain regions 136c-d and the third pair of source/drain regions 136d-e share a source/drain region. For example, the second pair of source/drain regions 136c-d comprises a third source/drain region 136c and a fourth source/drain region 136d, and the third pair of source/drain regions 136d-e comprises the fourth source/drain region 136d and a fifth source/drain region 136e. In other embodiments, the second pair of source/drain regions 136c-d and the third pair of source/drain regions 136d-e may each have their own discrete source/drain regions.

The first readout transistor 130a is at least partially disposed between the first plurality of the photodetectors 106a-d. In some embodiments, the first readout transistor 130a is a reset transistor. In such embodiments, the first readout transistor 130a is configured to provide a reset voltage (e.g., about 5 V) to the first floating diffusion node 112a, the second floating diffusion node 112b, the third floating diffusion node 112c, and/or the fourth floating diffusion node 112d between exposure periods of incident radiation.

In some embodiments, the first source/drain region 136a and/or the second source/drain region 136b are at least partially disposed directly over the first isolation structure 108. In further embodiments, the first source/drain region 136a and/or the second source/drain region 136b are entirely disposed directly over the first isolation structure 108. In some embodiments, the first readout gate electrode 132a (and/or the first readout gate dielectric 134a) is at least partially disposed directly over the first isolation structure 108. In further embodiments, the first readout gate electrode 132a (and/or the first readout gate dielectric 134a) is disposed directly over both the first isolation structure 108 and the first doped region 104. In yet further embodiments, the first readout gate electrode 132a (and/or the first readout gate dielectric 134a) is disposed directly over a first portion of the first doped region 104, which laterally surrounds the first photodetector 106a; a second portion of the first doped region 104, which laterally surrounds the second photodetector 106b; a third portion of the first doped region 104, which laterally surrounds the third photodetector 106c; and a fourth portion of the first doped region 104, which laterally surrounds the fourth photodetector 106d.

A first one of the first conductive contacts 140 (hereinafter "fifth conductive contact 140a") is electrically coupled to the first source/drain region 136a. A second one of the first conductive contacts 140 (hereinafter "sixth conductive contact 140b") is electrically coupled to the first readout gate electrode 132a. A third one of the first conductive contacts 140 (hereinafter "seventh conductive contact 140c") is electrically coupled to the second source/drain region 136b. In some embodiments, the fifth conductive contact 140a, the sixth conductive contact 140b, and/or the seventh conductive contact 140c are disposed directly over the first isolation structure 108.

A first portion of the active region 126 is disposed beneath the first readout gate electrode 132a and extends between the first source/drain region 136a and the second source/drain region 136b. The first readout transistor 130a is configured to selectively form a conductive channel in the first portion of the active region 126 that extends between the first source/drain region 136a and the second source/drain region 136b. In some embodiments, the first portion of the active region 126 may be referred to as a first well region.

In some embodiments, a first well extension region 204 extends laterally from the first well region in a direction perpendicular to a direction in which the first pair of source/drain regions 136a-b are spaced apart. The first well extension region 204 is a portion of the active region 126 and is electrically coupled to the first well region. In some embodiments, the first well extension region 204 is at least partially disposed directly over the first isolation structure 108. In further embodiments, the first well extension region 204 is entirely disposed directly over the first isolation structure 108.

A fourth one of the first conductive contacts 140 (hereinafter "eighth conductive contact 140d") is electrically coupled to the first well extension region 204. In some embodiments, the eighth conductive contact 140d is disposed directly over the first isolation structure 108. In further embodiments, the eighth conductive contact 140d is configured to provide an electrical connection between the first well extension region 204 and ground.

The second readout transistor 130b is at least partially disposed between the second plurality of the photodetectors 106b,c,e,f. In some embodiments, the second readout transistor 130b is a source follower transistor. In such embodiments, the second readout transistor 130b is configured to selectively output voltages based on charges that are transferred to the second readout transistor 130b from the first photodetector 106a, the second photodetector 106b, the third photodetector 106c, and/or the fourth photodetector 106d.

In some embodiments, the third source/drain region 136c and/or the fourth source/drain region 136d are at least partially disposed directly over the first isolation structure 108. In further embodiments, the third source/drain region 136c and/or the fourth source/drain region 136d are entirely disposed directly over the first isolation structure 108. In some embodiments, the second readout gate electrode 132b (and/or the second readout gate dielectric 134b) is at least partially disposed directly over the first isolation structure 108. In further embodiments, the second readout gate electrode 132b (and/or the second readout gate dielectric 134b) is disposed directly over the first isolation structure 108, the first doped region 104, and the second plurality of the photodetectors 106b,c,e,f. In further embodiments, the second readout gate electrode 132b (and/or the second readout gate dielectric 134a) is disposed directly over the second portion of the first doped region 104; the third portion of the first doped region 104; a fifth portion of the first doped region 104, which laterally surrounds the fifth photodetector 106e; and a sixth portion of the first doped region 104, which laterally surrounds the sixth photodetector 106f. In yet further embodiments, the second readout gate electrode 132b (and/or the second readout gate dielectric 134b) is disposed directly over a portion of the second photodetector 106b, a portion of the third photodetector 106c, a portion of the fifth photodetector 106e, and a portion of the sixth photodetector 106f.

A fifth one of the first conductive contacts 140 (hereinafter "ninth conductive contact 140e") is electrically coupled to the third source/drain region 136c. A sixth one of the first conductive contacts 140 (hereinafter "tenth conductive contact 140f") is electrically coupled to the second readout gate electrode 132b. In some embodiments, the ninth conductive contact 140e and/or the tenth conductive contact 140f are disposed directly over the first isolation structure 108.

A second portion of the active region 126 is disposed beneath the second readout gate electrode 132b and extends between the third source/drain region 136c and the fourth source/drain region 136d. The second readout transistor 130b is configured to selectively form a conductive channel in the second portion of the active region 126. In some embodiments, the second portion of the active region 126 may be referred to as a second well region.

In some embodiments, a second well extension region 206 extends laterally from the second well region in a direction perpendicular to a direction in which the second pair of source/drain regions 136c-d are spaced apart. The second well extension region 206 is a portion of the active region 126 and is electrically coupled to the second well region. In some embodiments, the second well extension region 206 is at least partially disposed directly over the first isolation structure 108. In further embodiments, the second well extension region 206 is entirely disposed directly over the first isolation structure 108.

A seventh one of the first conductive contacts 140 (hereinafter "eleventh conductive contact 140g") is electrically coupled to the second well extension region 206. In some embodiments, the eleventh conductive contact 140g is disposed directly over the first isolation structure 108. In further embodiments, the eleventh conductive contact 140g is configured to provide an electrical connection between the second well extension region 206 and ground.

The third readout transistor 130c is at least partially disposed between the third plurality of the photodetectors 106c,f,g,h. In some embodiments, the third readout transistor 130c is a row select transistor. In such embodiments, the third readout transistor 130c is configured to output a voltage to the second readout transistor 130b, such that the first photodetector 106a, the second photodetector 106b, the third photodetector 106c, and/or the fourth photodetector 106d may be read.

In some embodiments, the fifth source/drain region 136e is at least partially disposed directly over the first isolation structure 108. In further embodiments, the fifth source/drain region 136e is entirely disposed directly over the first isolation structure 108. In some embodiments, the third readout gate electrode 132c (and/or the third readout gate dielectric 134c) is at least partially disposed directly over the first isolation structure 108. In further embodiments, the third readout gate electrode 132c (and/or the third readout gate dielectric 134c) is disposed directly over the first isolation structure 108 and the first doped region 104. In yet further embodiments, the third readout gate electrode 132c (and/or the third readout gate dielectric 134c) is disposed directly over the third portion of the first doped region 104; the sixth portion of the first doped region 104; a seventh portion of the first doped region 104, which laterally surrounds the seventh photodetector 106g; and an eighth portion of the first doped region 104, which laterally surrounds the eighth photodetector 106h.

An eighth one of the first conductive contacts 140 (hereinafter "twelfth conductive contact 140h") is electrically coupled to the fifth source/drain region 136e. A ninth one of the first conductive contacts 140 (hereinafter "thirteenth conductive contact 140i") is electrically coupled to the third readout gate electrode 132c. In some embodiments, the twelfth conductive contact 140h and/or the thirteenth conductive contact 140i are disposed directly over the first isolation structure 108.

A third portion of the active region 126 is disposed beneath the third readout gate electrode 132c and extends between the fourth source/drain region 136d and the fifth source/drain region 136e. The third readout transistor 130c is configured to selectively form a conductive channel in the third portion of the active region 126. In some embodiments, the third portion of the active region 126 may be referred to as a third well region.

In some embodiments, a third well extension region 208 and a fourth well extension region 210 extend laterally from the third well region in opposite directions that are both perpendicular to a direction in which the third pair of source/drain regions 136d-e are spaced apart. The third well extension region 208 and the fourth well extension region 210 are portions of the active region 126 and are electrically coupled to the third well region. In some embodiments, the third well extension region 208 and/or the fourth well extension region 210 are at least partially disposed directly over the first isolation structure 108. In further embodiments, the third well extension region 208 and/or the fourth well extension region 210 are entirely disposed directly over the first isolation structure 108. It will be appreciated that, in some embodiments, only one well extension region may extend laterally from the third well region.

A tenth one of the first conductive contacts 140 (hereinafter "fourteenth conductive contact 140j") is electrically coupled to the third well extension region 208. An eleventh one of the first conductive contacts 140 (hereinafter "fifteenth conductive contact 140k") is electrically coupled to the fourth well extension region 210. In some embodiments, the fourteenth conductive contact 140j and/or the fifteenth conductive contact 140k are disposed directly over the first isolation structure 108. In further embodiments, the fourteenth conductive contact 140j is configured to provide an electrical connection between the third well extension region 208 and ground, and the fifteenth conductive contact 140k is configured to provide an electrical connection between the fourth well extension region 210 and ground.

Figure 3:
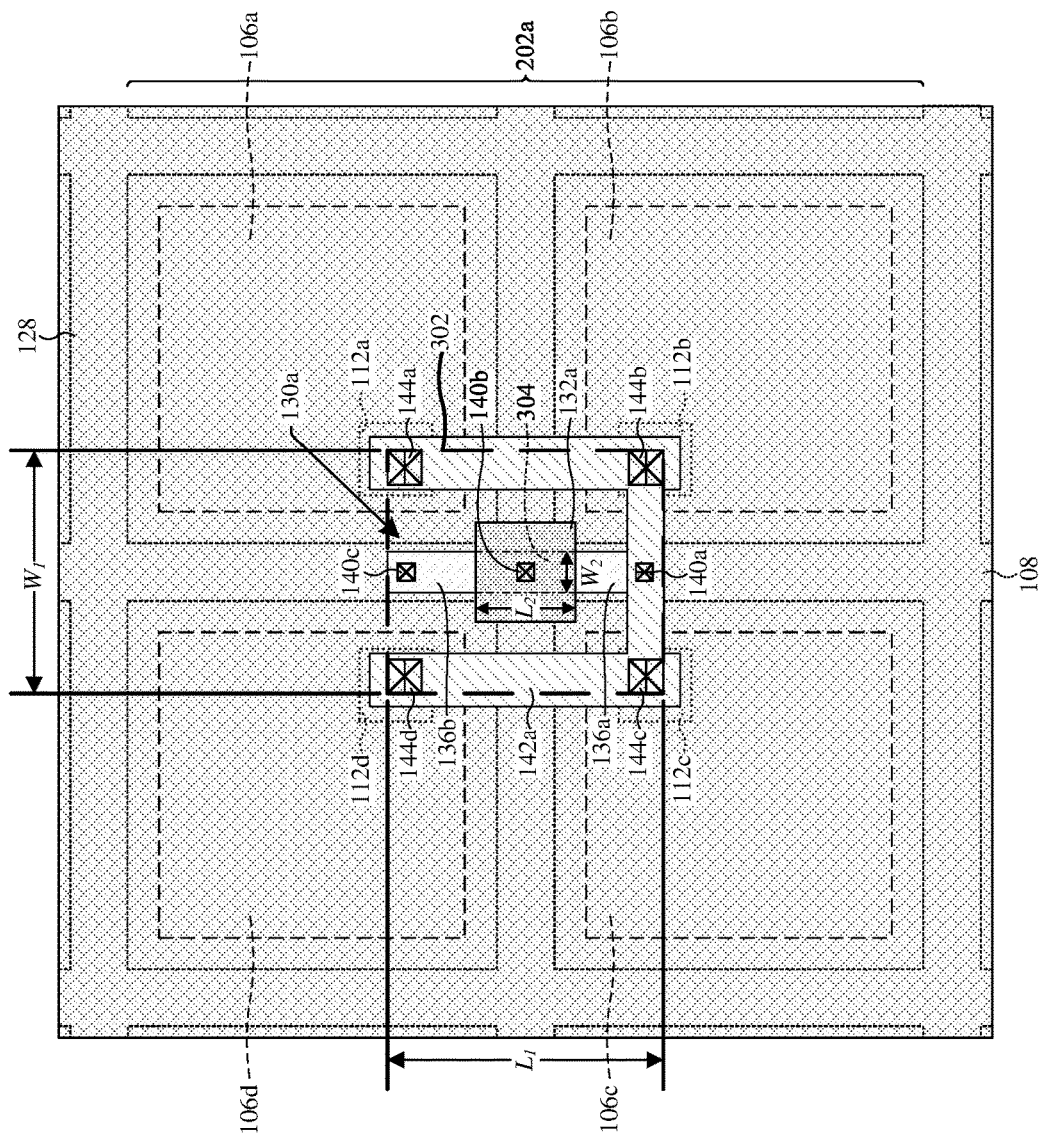
FIG. 3 illustrates a layout view of some other embodiments of the first array of FIG. 2.

FIG. 3 illustrates a layout view of some other embodiments of the first array 202a of FIG. 2.

As shown in FIG. 3, in some embodiments, the first well extension region 204 is not disposed in the second semiconductor substrate 124. In such embodiments, the eighth conductive contact 140d may not be disposed over the second semiconductor substrate 124. In further such embodiments, the conducive channels formed by the plurality of readout transistors 130a-c may extend fully from an upper surface of the second semiconductor substrate 124 to a bottom surface of the second semiconductor substrate 124 (e.g., fully-depleted). In yet further such embodiments, the active region 126 may be undoped or lightly-doped (e.g., having a doping concentration of first doping type dopants that is less than a doping concertation of the first doping type dopants of the first doped region 104).

A floating diffusion nodes contacts (FDNC) region 302 is partially defined by outer sidewalls of the first conductive contact 144a, the second conductive contact 144b, the third conductive contact 144c, and the fourth conductive contact 144d (hereinafter collectively referred to as "FDN contacts 144a-d"). For example, a first side of the FDNC region 302 may be defined by a substantially straight line extending from an outer sidewall of the first conductive contact 144a to an outer sidewall of the second conductive contact 144b, and a second side of the FDNC region 302 opposite the first side may be defined by a substantially straight line extending from an outer sidewall of the third conductive contact 144c to an outer sidewall of the fourth conductive contact 144d. In some embodiments, each of the FDN contacts 144a-d are entirely disposed within a perimeter of the FDNC region 302.

The FDNC region 302 has a first width $W_1$ and a first length $L_1$. In some embodiments, the first length $L_1$ is between about 120 nanometers (nm) and about 590 nm. The first width $W_1$ may be between about 120 nm and about 590 nm. In further embodiments, the first length $L_1$ and the first width $W_1$ may be about the same. In other embodiments, the first length $L_1$ and the first width $W_1$ may be different. In yet further embodiments, an area of the FDNC region 302 is equal to the first length $L_1$ multiplied by the first width $W_1$. The area of the FDNC region 302 may be between about 14,400 square nanometers ($nm^2$) and about 348,100 $nm^2$.

In some embodiments, a width of each of the FDN contacts 144a-d is between about 40 nm and about 120 nm. A length of each of the FDN contacts 144a-d may be between about 40 nm and about 120 nm. In further embodiments, a distance in which two of the FDN contacts 144a-d are spaced apart is between about 56 nm and about 496 nm. More specifically, the first conductive contact 144a may be spaced from the second conductive contact 144b and/or the fourth conductive contact 144d by between about 40 nm and about 350 nm; the third conductive contact 144c may be spaced from the second conductive contact 144b and/or the fourth conductive contact 144d by between about 40 nm and about 350 nm; the first conductive contact 144a may be spaced from the third conductive contact 144c by between about 56 nm and about 496 nm; and/or the second conductive contact 144b may be spaced from the fourth conductive contact 144d by between about 56 nm and about 496 nm.

A selectively-conductive channel region 304 is disposed in the second semiconductor substrate 124. The selectively-conductive channel region 304 is part of the first portion of the active region 126 and extends laterally between the first source/drain region 136a and the second source/drain region 136b. In some embodiments, the selectively-conductive channel region 304 is defined by the conductive channel that the first readout transistor 130a selectively forms between the first source/drain region 136a and the second source/drain region 136b. In other embodiments, the selectively-conductive channel region 304 may be defined by extending substantially straight lines from opposite sides of the first source/drain region 136a to opposite sides of the second source/drain region 136b, respectively.

The selectively-conductive channel has a second width $W_2$ and a first length $L_2$. An area of the selectively-conductive channel region 304 is equal to the second length $L_2$ multiplied by the second width $W_2$. In some embodiments, at least half of the area of the selectively-conductive channel region 304 is disposed within the perimeter of the FDNC region 302.

A first one of the first conductive lines 142 (hereinafter "first conductive line 142a") is disposed over the second semiconductor substrate 124 and the first readout transistor 130a. In some embodiments, the first conductive line 142a directly overlies each of the first plurality of the photodetectors 106a-d, each of the floating diffusion nodes 112a-d, the first isolation structure 108, and the first source/drain region 136a. In further embodiments, the first conductive line 142a is continuous and extends laterally along only a single lateral plane. In yet further embodiments, the first conductive line 142a may be the nearest conductive line to the FDN contacts 144a-d and the fifth conductive contact 140a (e.g., metal 1). In other embodiments, other conductive lines may be disposed between the FDN contacts 144a-d and the first conductive line 142a (e.g., the first conductive line 142a may be on metal 2, 3, 4, etc.).

In some embodiments, the FDN contacts 144a-d and the fifth conductive contact 140a are electrically coupled to the first conductive line 142a. In other words, the first conductive line 142a electrically couples each of the FDN contacts 144a-d and the fifth conductive contact 140a together. In such embodiments, the FDN contacts 144a-d extend entirely through the first ILD structure 120, entirely through the second semiconductor substrate 124 (or the second isolation structure 128), and into the second ILD structure 138 to electrically couple the floating diffusion nodes 112a-d to the first conductive line 142a. For clarity, some of the conductive contacts (e.g., the FDN contacts 144a-d and the fifth conductive contact 140a) are illustrated by a six-sided asterisk disposed in a box to illustrate such conductive contacts are electrically coupled together.

Because at least half of the area of the selectively-conductive channel region 304 is within the perimeter of the FDNC region 302, and because the FDN contacts 144a-d and the fifth conductive contact 140a are electrically coupled to the first conductive line 142a, the total conductive area of the first interconnect structure may be further reduced. Accordingly, the noise performance of the low-noise image sensor 100 may be further improved.

Figure 4:
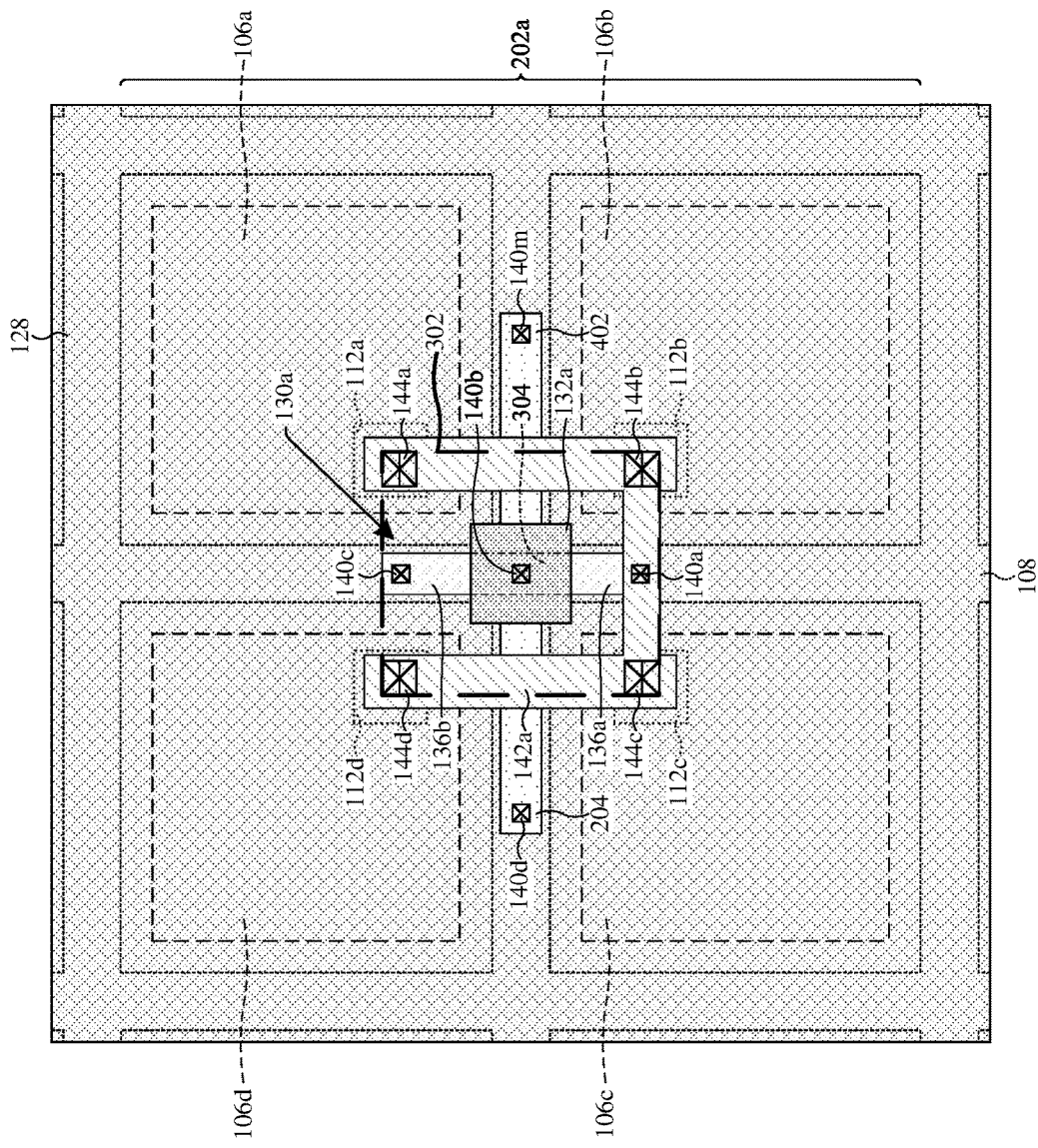
FIG. 4 illustrates a layout view of some other embodiments of the first array of FIG. 3.

FIG. 4 illustrates a layout view of some other embodiments of the first array 202a of FIG. 3.

As shown in FIG. 4, both the first well extension region 204 and a fifth well extension region 402 extend laterally from the first well region. The fifth well extension region 402 extends in an opposite direction than the first well extension region 204. The fifth well extension region 402 is a portion of the active region 126 and is electrically coupled to the first well region. In some embodiments, the fifth well extension region 402 is at least partially disposed directly over the first isolation structure 108. In further embodiments, the fifth well extension region 402 is entirely disposed directly over the first isolation structure 108.

A twelfth one of the first conductive contacts (hereinafter "sixteenth conductive contact 140m") is electrically coupled to the fifth well extension region 402. In some embodiments, the sixteenth conductive contact 140m is disposed directly over the first isolation structure 108. In further embodiments, the sixteenth conductive contact 140m is configured to provide an electrical connection between the fifth well extension region 402 and ground.

Figure 5:
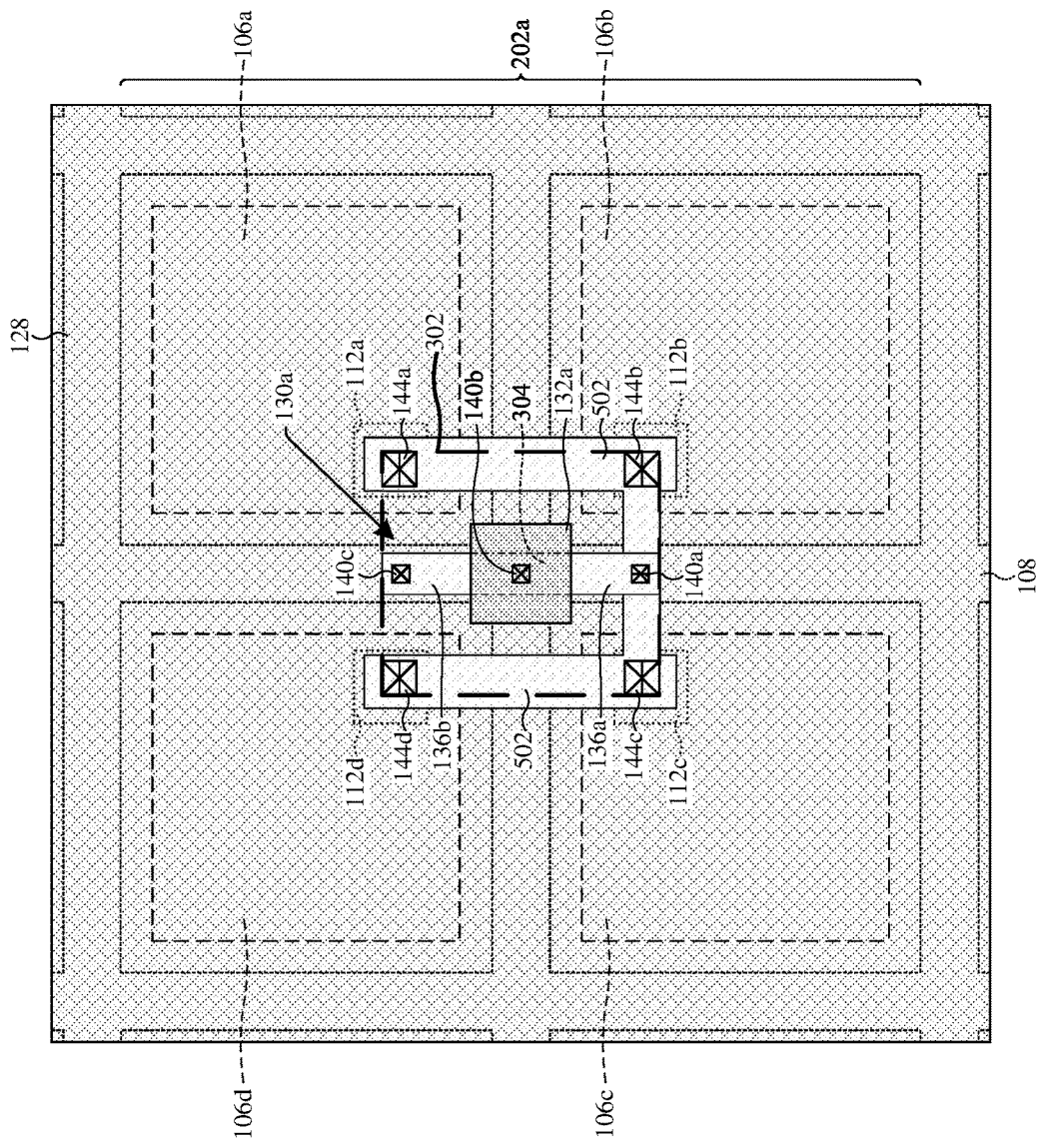
FIG. 5 illustrates a layout view of some other embodiments of the first array of FIG. 3.

FIG. 5 illustrates a layout view of some other embodiments of the first array 202a of FIG. 3.

As shown in FIG. 5, a third doped region 502 is disposed in the second semiconductor substrate 124. The third doped region 502 is a portion of the second semiconductor substrate 124 having the second doping type. The third doped region 502 directly contacts the first source/drain region 136a, such that the third doped region 502 is electrically coupled to the first source/drain region 136a.

In some embodiments, the FDN contacts 144a-d and the fifth conductive contact 140a are electrically coupled to the third doped region 502. In other words, the third doped region 502 electrically couples each of the FDN contacts 144a-d and the fifth conductive contact 140a together. In such embodiments, the FDN contacts 144a-d may not extend entirely through the second semiconductor substrate 124. Rather, the FDN contacts 144a-d may extend through the first ILD structure 120 and to (or partially into) the second semiconductor substrate 124 to electrically couple the floating diffusion nodes 112a-d to the third doped region 502. Because the FDN contacts 144a-d and the fifth conductive contact 140a are electrically coupled to the third doped region 502, the total conductive area of the first interconnect structure may be further reduced. Accordingly, the noise performance of the low-noise image sensor 100 may be further improved.

Figure 6:
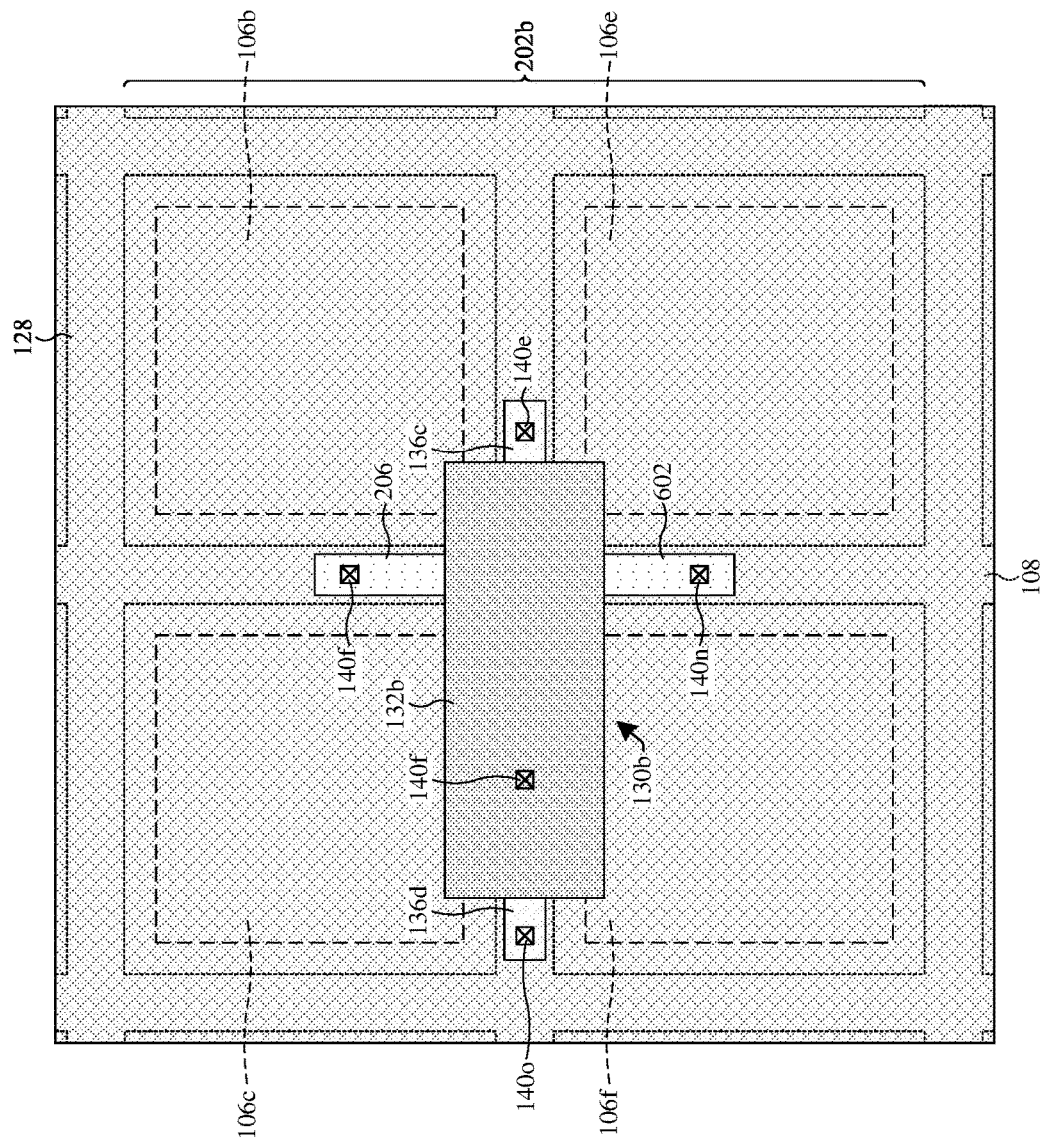
FIG. 6 illustrates a layout view of some other embodiments of the second array of FIG. 2.

FIG. 6 illustrates a layout view of some other embodiments of the second array 202b of FIG. 2.

As shown in FIG. 6, both the second well extension region 206 and a sixth well extension region 602 extend laterally from the second well region. The sixth well extension region 602 extends in an opposite direction than the second well extension region 206. The sixth well extension region 602 is a portion of the active region 126 and is electrically coupled to the second well region. In some embodiments, the sixth well extension region 602 is at least partially disposed directly over the first isolation structure 108. In further embodiments, the sixth well extension region 602 is entirely disposed directly over the first isolation structure 108.

A thirteenth one of the first conductive contacts (hereinafter "seventeenth conductive contact 140n") is electrically coupled to the sixth well extension region 602. In some embodiments, the seventeenth conductive contact 140n is disposed directly over the first isolation structure 108. In further embodiments, the seventeenth conductive contact 140n is configured to provide an electrical connection between the sixth well extension region 602 and ground.

In some embodiments, a fourteenth one of the first conductive contacts (hereinafter "eighteenth conductive contact 140o") is electrically coupled to the fourth source/drain region 136d. In further embodiments, the eighteenth conductive contact is disposed directly over the first isolation structure 108.

Figure 7:
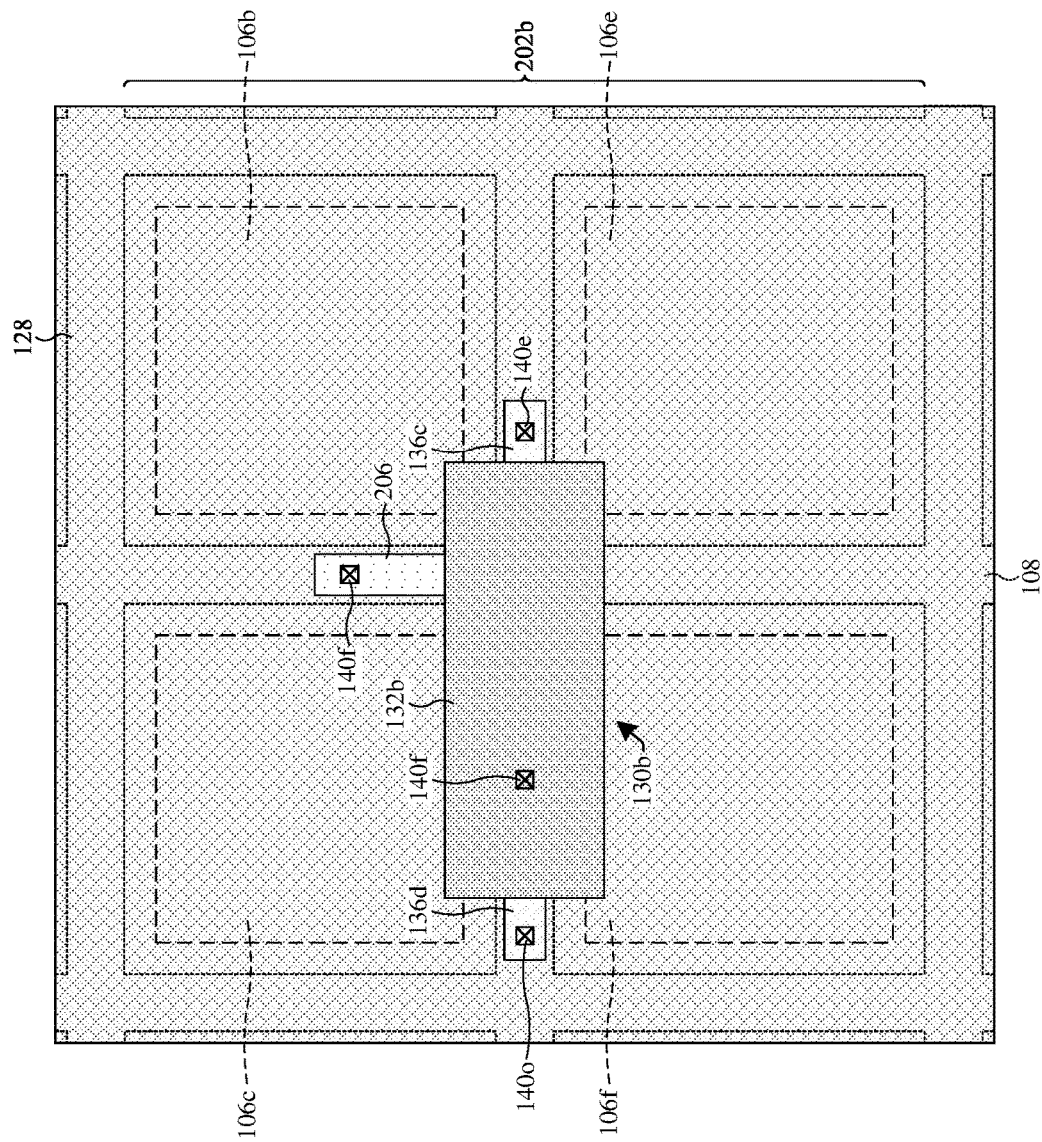
FIG. 7 illustrates a layout view of some other embodiments of the second array of FIG. 6.

FIG. 7 illustrates a layout view of some other embodiments of the second array 202b of FIG. 6.

As shown in FIG. 7, in some embodiments, only the second well extension region 206 extends laterally from the second well region. It will be appreciated that, in some embodiments, only the sixth well extension region 602 may extend laterally from the second well region.

Figure 8:
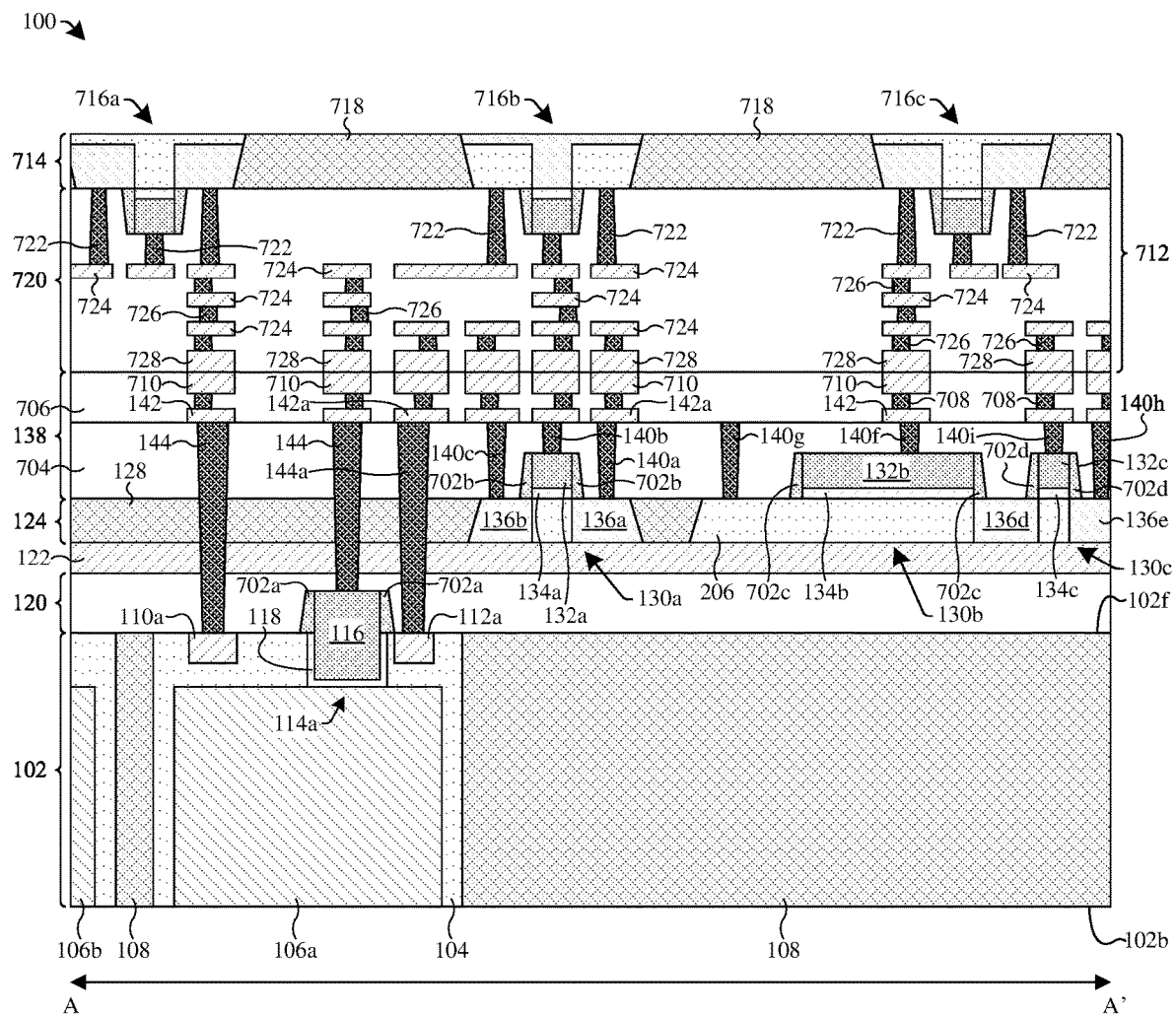
FIG. 8 illustrates a cross-sectional view of some embodiments of the low-noise image sensor of FIG. 2 taken along line A-A'.

FIG. 8 illustrates a cross-sectional view of some embodiments of the low-noise image sensor 100 of FIG. 2 taken along line A-A'.

As shown in FIG. 8, the low-noise image sensor 100 comprises a plurality of sidewall spacers 702a-d. The sidewall spacers 702a-d are disposed along sidewalls of the transfer gate electrode 116 and the readout gate electrodes 132a-c. For example, a first sidewall spacer 702a is disposed over the first semiconductor substrate 102 and along sidewalls of the transfer gate electrode 116; a second sidewall spacer 702b is disposed over the second semiconductor substrate 124 and along sidewalls of the first readout gate electrode 132a and sidewalls of the first readout gate dielectric 134a; a third sidewall spacer 702c is disposed over the second semiconductor substrate 124 and along sidewalls of the second readout gate electrode 132b and sidewalls of the second readout gate dielectric 134b; and a fourth sidewall spacer 702d is disposed over the second semiconductor substrate 124 and along sidewalls of the third readout gate electrode 132c and sidewalls of the third readout gate dielectric 134c. In some embodiments, the sidewall spacers 702a-d may comprise, for example, a nitride (e.g., silicon nitride (SiN)), an oxy-nitride (e.g., silicon oxy-nitride (Si$O_xN_y$)), or the like.

The second ILD structure 138 comprises a lower ILD structure 704 and an upper ILD structure 706. The lower ILD structure 704 separates the upper ILD structure 706 from the second semiconductor substrate 124. In some embodiments, the lower ILD structure 704 has an upper surface that is substantially co-planar with upper surfaces of the first conductive contacts 140 and upper surfaces of the second conductive contacts 144.

In some embodiments, the first conductive lines 142, a plurality of first conductive vias 708 (e.g., metal vias), and a plurality of first contact pads 710 (e.g., metal contact pads) are disposed in the upper ILD structure 706. It will be appreciated that, in some embodiments, any number of first conductive lines 142 and first conductive vias 708 may be stacked in the upper ILD structure 706. In further embodiments, the upper ILD structure 706 has an upper surface that is substantially co-planar with upper surfaces of the first contact pads 710. The first conductive contacts 140, the second conductive contacts 144, the first conductive lines 142, the first conductive vias 708, and the first contact pads 710 are electrically coupled together in a predefined manner and configured to provide electrical connections between the various devices disposed on/over the first semiconductor substrate 102 and the second semiconductor substrate 124 (e.g., the floating diffusion nodes 112a-d, the transfer gates 114a-d, the pickup well contact regions 110a-d, the readout transistors 130a-c). In yet further embodiments, the first conductive vias 708 and the first contact pads 710 may at least partially define the first interconnect structure.

An integrated chip (IC) 712 is disposed over the second ILD structure 138, the second semiconductor substrate 124, and the first semiconductor substrate 102. In some embodiments, the IC 712 comprises an application-specific integrated circuit (ASIC). The IC 712 comprises a third semiconductor substrate 714. A plurality of semiconductor devices 716a-c (e.g., p-channel MOSFETs, n-channel MOSFETs, etc.) are disposed on the third semiconductor substrate 714. In some embodiments, the semiconductor devices 716a-c are image processing devices configured to process signals output by the readout transistors 130a-c. In further embodiments, a third isolation structure 718 is disposed in the third semiconductor substrate 714 and between the semiconductor devices 716a-c.

A third ILD structure 720 is disposed between the third semiconductor substrate 714 and the second ILD structure 138. A plurality of third conductive contacts 722 (e.g., metal contacts), a plurality of second conductive lines 724 (e.g., metal lines), a plurality of second conductive vias 726 (e.g., metal vias), and a plurality of second contact pads 728 (e.g., metal contact pads) are disposed in the third ILD structure 720. In some embodiments, the third ILD structure has a lower surface that is substantially co-planar with lower surfaces of the second contact pads 728. The third conductive contacts 722, the second conductive lines 724, the second conductive vias 726, and the second contact pads 728 are electrically coupled together in a predefined manner and configured to provide electrical connections between the various devices disposed on the third semiconductor substrate 714 (e.g., the semiconductor devices 716a-c). In further embodiments, the third conductive contacts 722, the second conductive lines 724, the second conductive vias 726, and the second contact pads 728 may at least partially define a second interconnect structure.

The third ILD structure 720 is bonded to the second ILD structure 138. The first contact pads 710 are bonded to the second contact pads 728, respectively, such that the first contact pads 710 are electrically coupled to the second contact pads 728, respectively. Accordingly, the transfer gates 114a-d, the readout transistors 130a-c, and the semiconductor devices 716a-c may be electrically coupled together in a predefined manner via the first and second interconnect structures. In some embodiments, the bonded together first contact pads 710 and second contact pads 728 are referred to as bonded contact pads.

The first transfer gate 114a is disposed between opposite sides of the first photodetector 106a. The transfer gate dielectric 118 of the first transfer gate 114a is disposed between the transfer gate electrode 116 of the first transfer gate 114a and the first photodetector 106a. In some embodiments, the first transfer gate 114a is disposed between the first pickup well contact region 110a and the first floating diffusion node 112a. In further embodiments, the first transfer gate 114a extends vertically through the front-side 102f of the first semiconductor substrate 102, such that the front-side 102f of the first semiconductor substrate 102 is disposed between an upper surface and a lower surface of the transfer gate electrode 116 of the first transfer gate 114a. An upper surface of the transfer gate dielectric 118 of the first transfer gate 114a may be substantially co-planar with the front-side 102f of the first semiconductor substrate 102. In further embodiments, the first pickup well contact region 110a is disposed between opposite sides of the first photodetector 106a. In yet further embodiments, one of the second conductive contacts 144 is electrically coupled to the first pickup well contact region 110a, and another one of the second conductive contacts 144 is electrically coupled to the transfer gate electrode 116 of the first transfer gate 114a.

In some embodiments, the first semiconductor substrate 102, the second semiconductor substrate 124, and the third semiconductor substrate 714 may comprise any type of semiconductor body (e.g., monocrystalline silicon/CMOS bulk, silicon-germanium (SiGe), silicon on insulator (SOI), etc.). In further embodiments, a thickness of the second semiconductor substrate 124 may be less than a thickness of the first semiconductor substrate 102 and/or the third semiconductor substrate 714. In yet further embodiments, the thickness of the second semiconductor substrate 124 may be such that the conducive channels formed by the plurality of readout transistors 130a-c may extend fully from the upper surface of the second semiconductor substrate 124 to the bottom surface of the second semiconductor substrate 124 (e.g., fully-depleted) or may extend partially between the upper surface of the second semiconductor substrate 124 and the lower surface of the second semiconductor substrate 124 (e.g., partially-depleted).

In some embodiments, each of the plurality of photodetectors 106a-h may comprise a photodetector collector region (not shown) that has a second doping type (e.g., n-type) different than the first doping type. In further embodiments, the pickup well contact regions 110a-d may have a higher doping concentration of first doping type dopants than the first doped region 104. The pickup well contact regions 110a-d are configured to provide regions of low resistance between conductive contacts and the first doped region 104. In yet further embodiments, the first isolation structure 108 may be a back-side deep trench isolation (BDTI) structure that extends fully or partially through the first semiconductor substrate 102.

In some embodiments, the transfer gate electrode 116 and the readout gate electrodes 132a-c may comprise, for example, doped polysilicon (e.g., n-type/p-type polysilicon), a metal (e.g., tungsten (W), aluminum (Al), titanium (Ti), molybdenum (Mo), nickel silicide (NiSi), or the like), or the like. In further embodiments, the transfer gate dielectric 118 and the readout gate dielectrics 134a-c may comprise, for example, an oxide (e.g., silicon dioxide ($SiO_2$)), a high-k dielectric material (e.g., hafnium oxide ($HfO_2$), zirconium oxide ($ZrO_2$), or some other dielectric material with a dielectric constant greater than about 3.9), or the like.

In some embodiments, the second isolation structure 128 and the third isolation structure 718 may be, for example, a shallow trench isolation (STI) structure, a deep trench isolation structure (DTI), or the like. In further embodiments, the first ILD structure 120, the second ILD structure 138, and the third ILD structure 720 comprise one or more stacked ILD layers, which may respectively comprise a low-k dielectric (e.g., a dielectric material with a dielectric constant less than about 3.9), an oxide (e.g., $SiO_2$), or the like. In further embodiments, the first conductive lines 142, the first conductive vias 708, the first contact pads 710, the second conductive lines 724, the second conductive vias 726, and the second contact pads 728, may comprise, for example, copper (Cu), Al, gold (Au), W, or the like. In yet further embodiments, the first conductive contacts 140, the second conductive contacts 144, and the third conductive contacts 722 may comprise, for example, W, Cu, Al, or the like.

Figure 9:
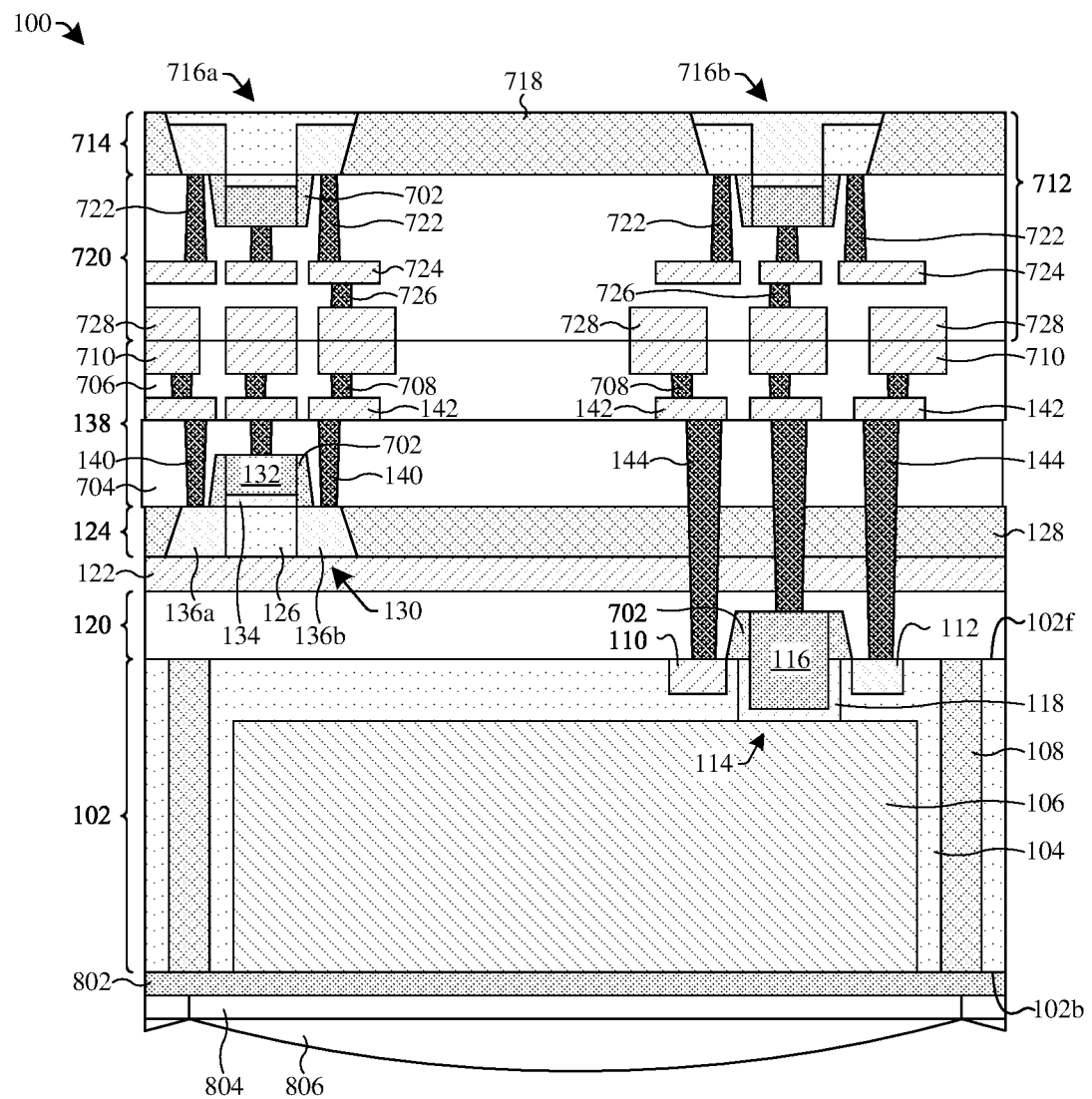
FIG. 9 illustrates a cross-sectional view of some other embodiments of the low-noise image sensor of FIG. 1.

FIG. 9 illustrates a cross-sectional view of some other embodiments of the low-noise image sensor 100 of FIG. 1.

As shown in FIG. 9, an anti-reflection layer 802 is disposed beneath the back-side 102*b* of the first semiconductor substrate 102. In some embodiments, the anti-reflection layer 802 contacts the photodetector 106, the first isolation structure 108, and the first doped region 104. The anti-reflection layer 802 is configured to reduce the amount of incident radiation reflected by the first semiconductor substrate 102. In some embodiments, the anti-reflection layer 802 comprises, for example, an oxide, a high-k dielectric, a nitride, or the like. In further embodiments, the anti-reflection layer 802 may comprise a first layer comprising an oxide stacked on a second layer comprising a high-k dielectric, or vice versa.

A plurality of light filters 804 (e.g., an infrared light filter, a red color filter, a blue color filter, a green color filter, etc.) are disposed on the anti-reflection layer 802. In some embodiments, the light filters 804 are arranged in an array below the anti-reflection layer 802. In further embodiments, the light filters 804 are disposed beneath the plurality of photodetectors 106*a-h*, respectively. The light filters 804 are configured to transmit specific wavelengths of incident radiation, respectively. For example, a first light filter (e.g., the red color filter) may transmit light having wavelengths within a first range, while a second light filter (e.g., the blue color filter) may transmit light having wavelengths within a second range different than the first range. Further, a plurality of micro-lenses 806 are disposed on the light filters 804, respectively. The micro-lenses 806 are configured to focus incident radiation towards the plurality of photodetectors 106*a-h*, respectively.

Figure 10:
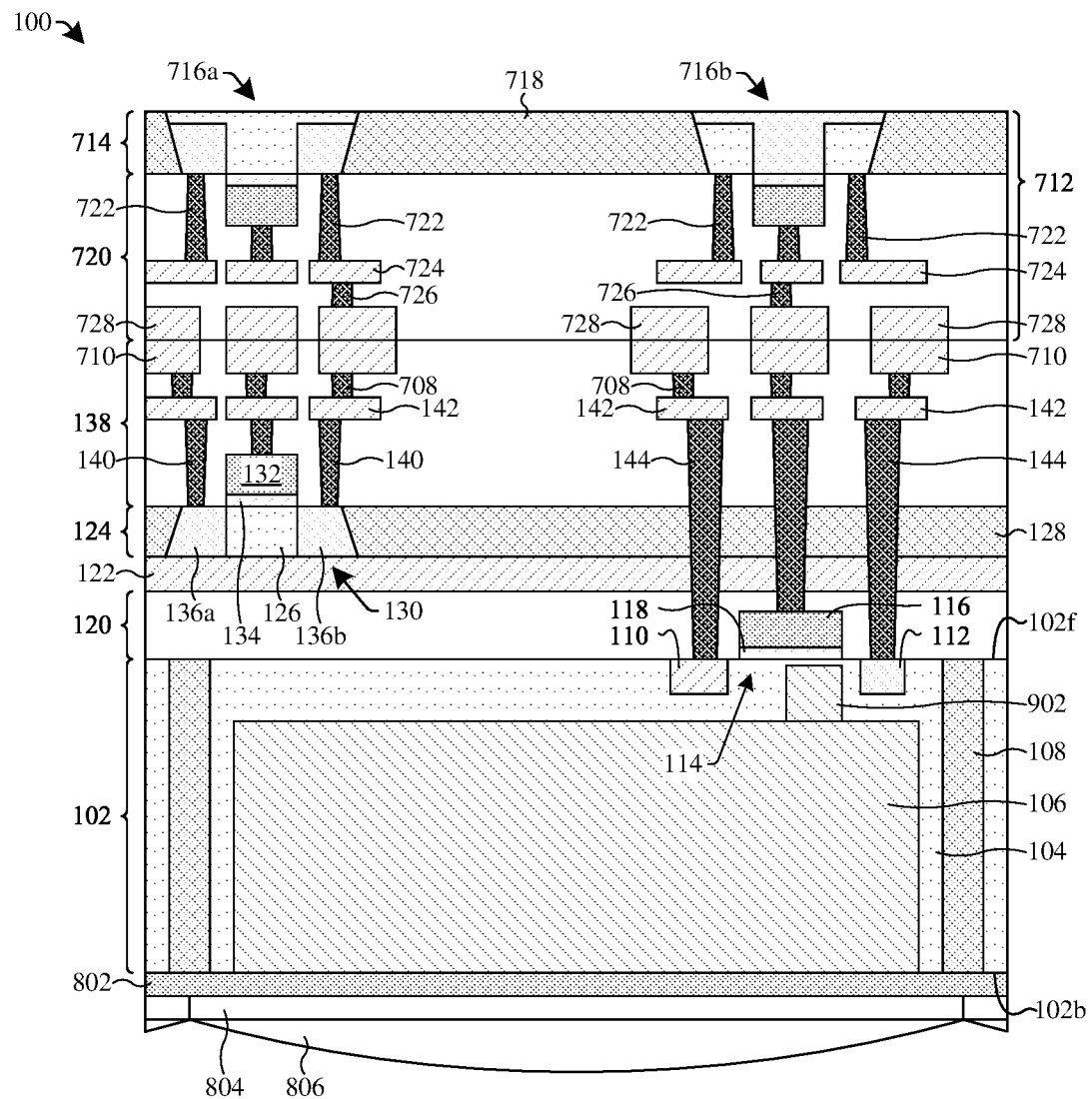
FIG. 10 illustrates a cross-sectional view of some other embodiments of the low-noise image sensor of FIG. 9.

FIG. 10 illustrates a cross-sectional view of some other embodiments of the low-noise image sensor 100 of FIG. 9.

As shown in FIG. 10, the transfer gate 114 does not extend into the first semiconductor substrate 102. Rather, the transfer gate 114 is disposed over the first semiconductor substrate 102. In such embodiments, the transfer gate 114 may be referred to as a planar transfer gate. In further such embodiments, both the transfer gate dielectric 118 and the transfer gate electrode 116 may be disposed over the first semiconductor substrate 102. In yet further such embodiments, a doped channel region 902 comprising the second doping type is disposed in the first semiconductor substrate 102. The doped channel region 902 is disposed directly between the photodetector 106 and the transfer gate 114.

Figure 11:
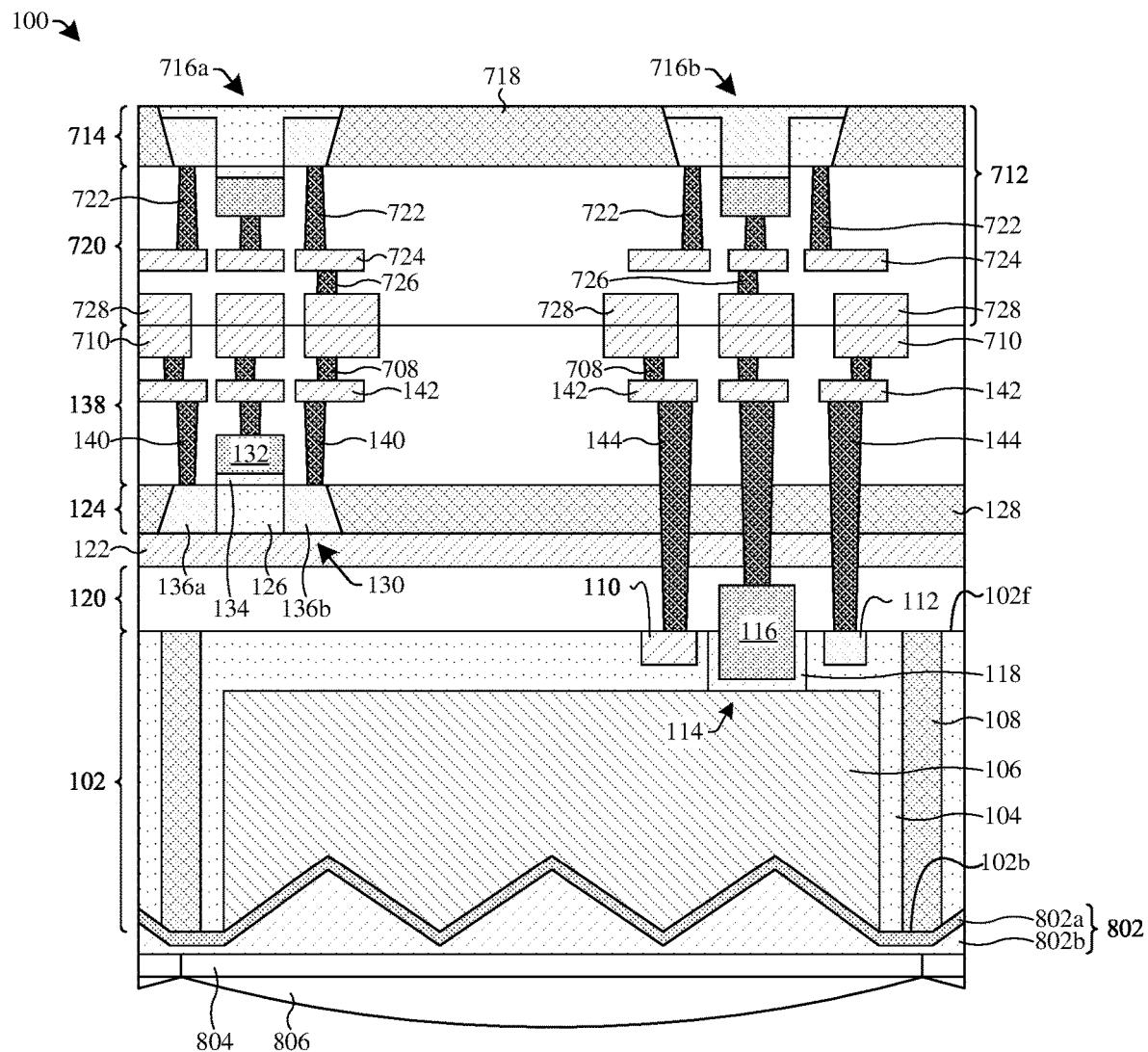
FIG. 11 illustrates a cross-sectional view of some other embodiments of the low-noise image sensor of FIG. 9.

FIG. 11 illustrates a cross-sectional view of some other embodiments of the low-noise image sensor 100 of FIG. 9.

As shown in FIG. 11, an upper surface of the anti-reflection layer 802 is non-planar. In such embodiments, the anti-reflection layer 802 may extend into the first semiconductor substrate 102 from beneath the back-side 102*b* of the first semiconductor substrate 102. In some embodiments, the anti-reflection layer 802 comprises a first anti-reflection layer 802*a* and a second anti-reflection layer 802*b*. In some embodiments, the first anti-reflection layer 802*a* may comprise, for example, a high-k dielectric, a nitride, or the like. In further embodiments, the second anti-reflection layer 802*b* may comprise, for example, an oxide, such as $SiO_2$, or the like.

Figure 12:
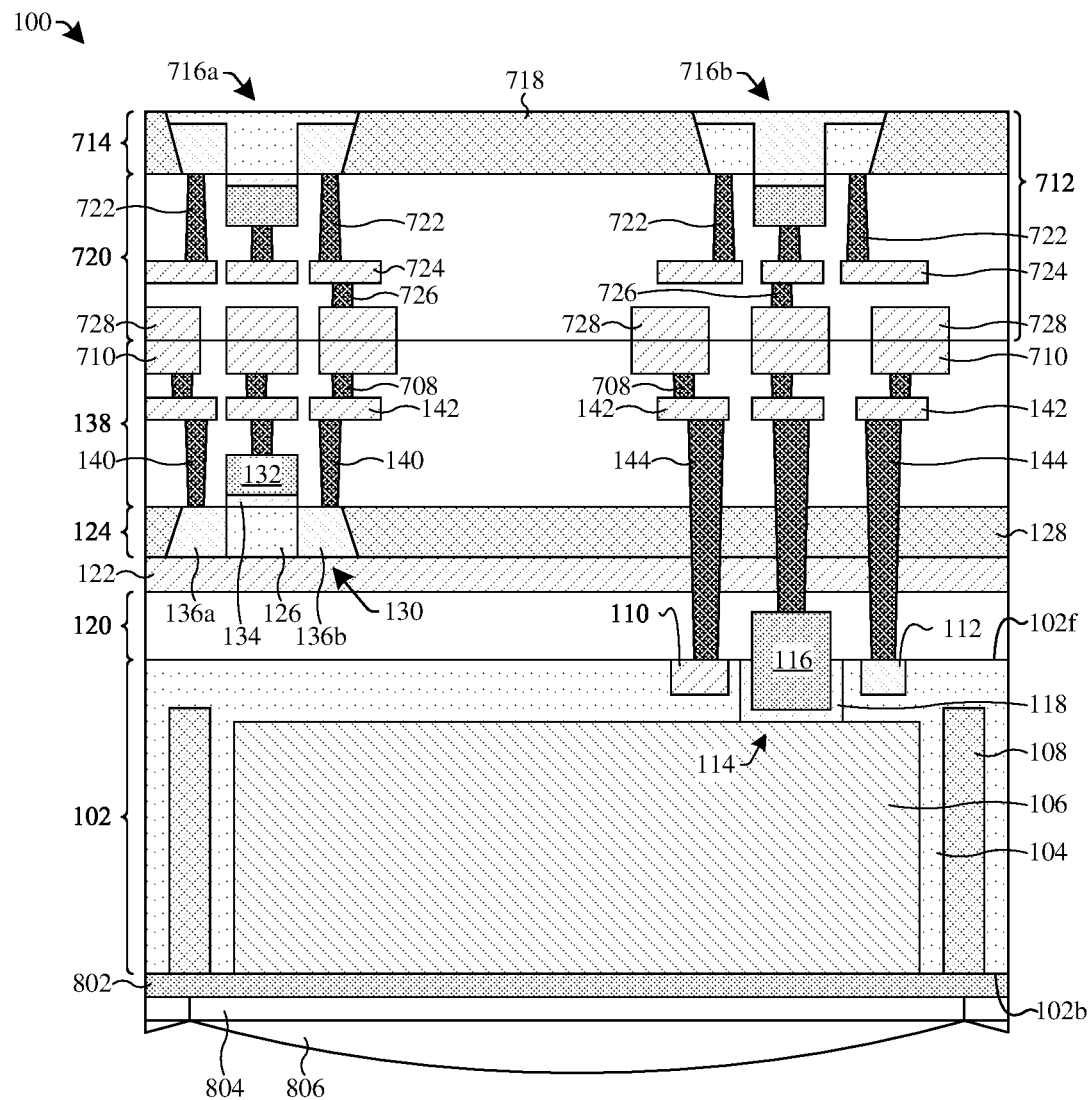
FIG. 12 illustrates a cross-sectional view of some other embodiments of the low-noise image sensor of FIG. 9.

FIG. 12 illustrates a cross-sectional view of some other embodiments of the low-noise image sensor 100 of FIG. 9.

As shown in FIG. 12, the first isolation structure 108 extends only partially through the first semiconductor substrate 102. In such embodiments, the first doped region 104 may be disposed between upper surfaces of the first isolation structure 108 and the front-side 102*f* of the first semiconductor substrate 102.

Figure 13:
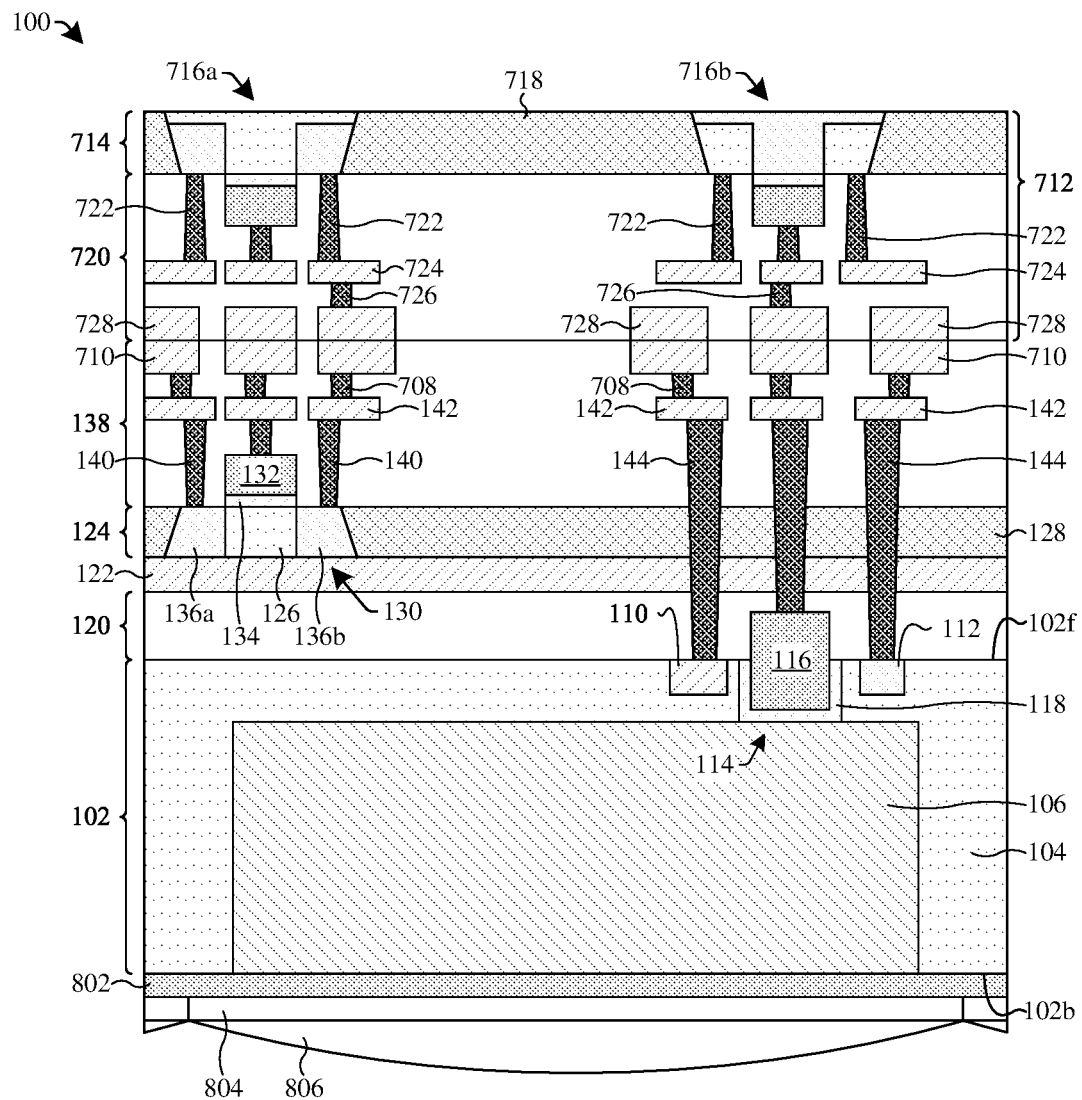
FIG. 13 illustrates a cross-sectional view of some other embodiments of the low-noise image sensor of FIG. 9.

FIG. 13 illustrates a cross-sectional view of some other embodiments of the low-noise image sensor 100 of FIG. 9.

As shown in FIG. 13, the first isolation structure 108 is not disposed in the first semiconductor substrate 102. Rather, only portions of the first semiconductor substrate (e.g., portions of the first doped region 104) may be disposed on opposite sides of the photodetector 106.

FIGS. 14-28 illustrate a series of cross-sectional views of some embodiments for forming the low-noise image sensor 100 of FIG. 9.

Figure 14:
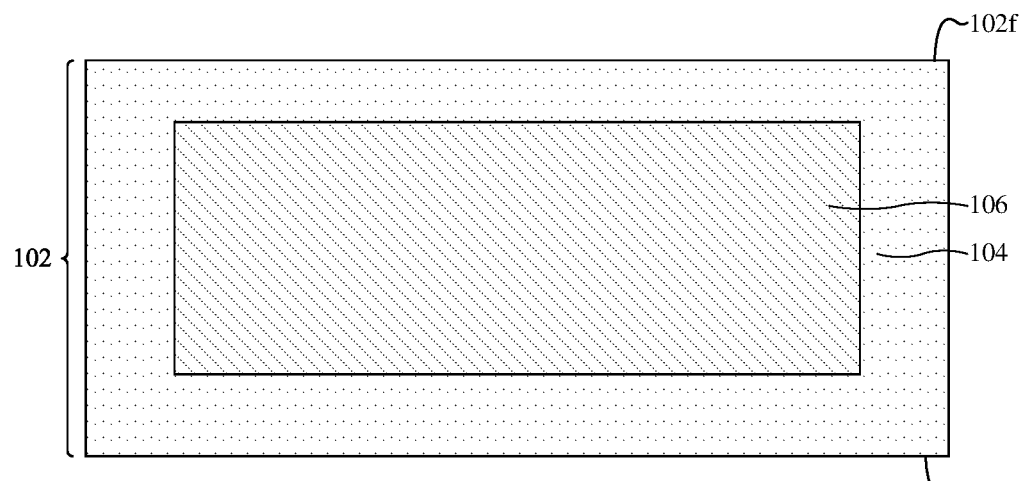
FIGS. 14-28 illustrate a series of cross-sectional views of some embodiments for forming the low-noise image sensor of FIG. 9.

As shown in FIG. 14, a first semiconductor substrate 102 is provided and a photodetector 106 is formed in the first semiconductor substrate 102. In some embodiments, before the photodetector 106 is formed, a first doped region 104 having a first doping type (e.g., p-type/n-type) is formed in the first semiconductor substrate 102. In further embodiments, a process for forming the first doped region 104 comprises performing a first implant process (e.g., a blanket ion implantation process) to implant first doping type dopants (e.g., p-type dopants) into the first semiconductor substrate 102. The photodetector 106 is a region of the first semiconductor substrate 102 having a second doping type (e.g., n-type/p-type) opposite the first doping type. In some embodiments, the photodetector 106 may be formed by a selective implant process (e.g., a selective ion implantation process) that utilizes a first masking layer (not shown) on the front-side 102*f* of the first semiconductor substrate 102 to selectively implant second doping type dopants (e.g., n-type dopants) into the first semiconductor substrate 102. Subsequently, in some embodiments, the first masking layer is stripped away. In further embodiments, a doped channel region 902 may be formed in the first semiconductor substrate 102. The doped channel region 902 may be formed between a portion of the photodetector 106 and the front-side 102*f* of the first semiconductor substrate 102. The doped channel region 902 may be formed by a selective implant process that utilizes a second masking layer (not shown) on the front-side 102*f* of the first semiconductor substrate 102 and partially covering the photodetector 106 to selectively implant the second doping type dopants into the first semiconductor substrate 102. Subsequently, in some embodiments, the second masking layer is stripped away.

Figure 15:
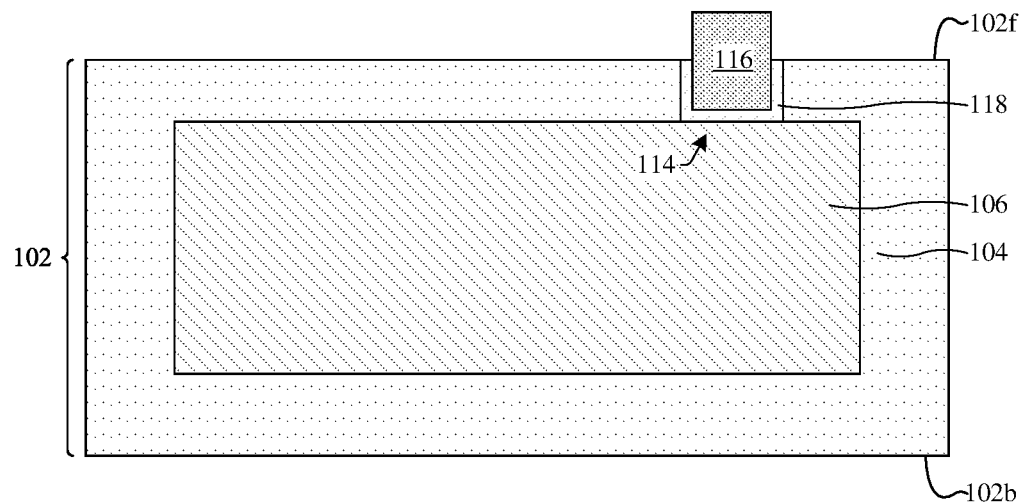

As shown in FIG. 15, a transfer gate 114 is formed in/over the first semiconductor substrate 102. In some embodiments, a process for forming the transfer gate 114 comprises selectively etching the first semiconductor substrate 102 to form a transfer gate opening that extends into the first semiconductor substrate 102 from the front-side 102*f* of the first semiconductor substrate 102. In further embodiments, selectively etching the first semiconductor substrate 102 comprises forming a masking layer (not shown) on the front-side 102*f* of the first semiconductor substrate 102, and subsequently exposing the first semiconductor substrate 102 to an etchant (e.g., wet/dry etchant) configured to selectively remove unmasked portions of the first semiconductor substrate 102.

Thereafter, a gate dielectric layer (not shown) is deposited or grown on the front-side 102*f* of the first semiconductor substrate 102 and lining the transfer gate opening. In some embodiments, the gate dielectric layer may be deposited or grown by, for example, chemical vapor deposition (CVD), physical vapor deposition (PVD), atomic layer deposition (ALD), thermal oxidation, sputtering, some other deposition or growth process, or a combination of the foregoing. In further embodiments, a planarization process (e.g., chemical-mechanical polishing (CMP)) may be performed into the gate dielectric layer, thereby forming the transfer gate dielectric 118.

Thereafter, a gate electrode layer may be deposited on the front-side 102f of the first semiconductor substrate 102 and on the transfer gate dielectric 118. In some embodiments, the gate dielectric layer may be deposited by, for example, CVD, PVD, ALD, sputtering, electrochemical plating, electroless plating, some other deposition process, or a combination of the foregoing. In some embodiments, the transfer gate electrode 116 may be formed by a selective etch process that utilizes a masking layer (not shown) on the gate electrode layer to selectively expose the gate electrode layer to an etchant (e.g., wet/dry etchant) that removes unmasked portions of the gate electrode layer. Subsequently, in some embodiments, the masking layer is stripped away. It will be appreciated that, in some embodiments, the selective etch process may be utilized to form the transfer gate dielectric 118.

Figure 16:
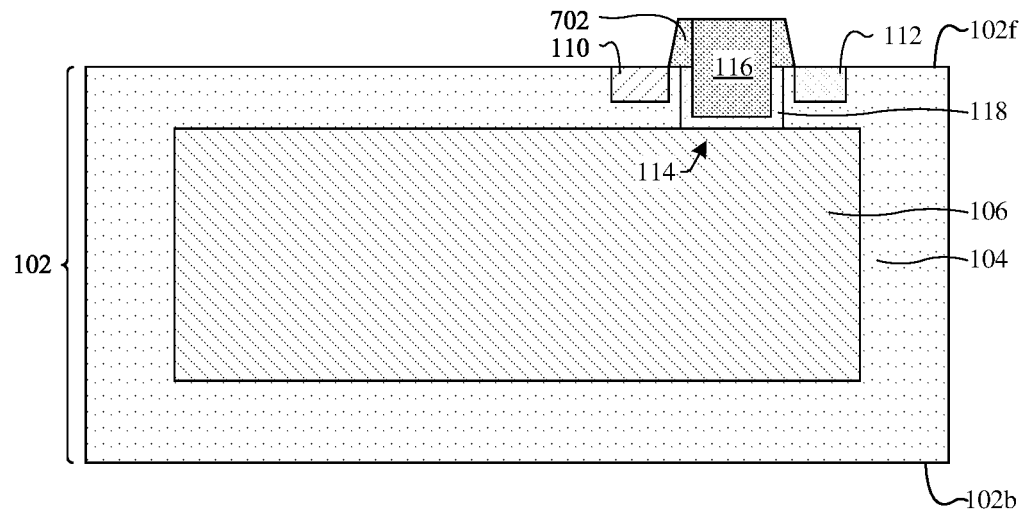

As shown in FIG. 16, a first sidewall spacer of a plurality of sidewall spacers 702 is formed over the first semiconductor substrate 102 and along sides of the transfer gate electrode 116. Further, a pickup well contact region 110 and a floating diffusion node 112 are formed in the first semiconductor substrate 102. The pickup well contact region 110 is a region of the first semiconductor substrate 102 having a higher doping concentration of the first doping type dopants than the first doped region 104. The floating diffusion node 112 is a region of the first semiconductor substrate 102 having the second doping type.

In some embodiments, the first sidewall spacer may be formed by depositing a first spacer layer (not shown) over the first semiconductor substrate 102 and covering the transfer gate electrode 116. In further embodiments, the first spacer layer may be deposited by PVD, CVD, ALD, sputtering, or the like. The first spacer layer is subsequently etched to remove the first spacer layer from horizontal surfaces, leaving the first spacer layer along opposing sides of the transfer gate electrode 116, as the first sidewall spacer. In various embodiments, the first spacer layer may comprise, for example, a nitride (e.g., SiN), an oxy-nitride (e.g., $SiO_XN_Y$), or the like.

In some embodiments, the pickup well contact region 110 may be formed by a first selective implant process that utilizes a first masking layer (not shown) on the front-side 102f of the first semiconductor substrate 102 and on the transfer gate 114 to selectively implant the first doping type dopants into the first semiconductor substrate 102. Subsequently, in some embodiments, the first masking layer is stripped away. In further embodiments, the floating diffusion node 112 may be formed by a second selective implant process that utilizes a second masking layer (not shown) on the front-side 102f of the first semiconductor substrate 102 and on the transfer gate 114 to selectively implant the second doping type dopants into the first semiconductor substrate 102. Subsequently, in some embodiments, the second masking layer is stripped away.

Figure 17:
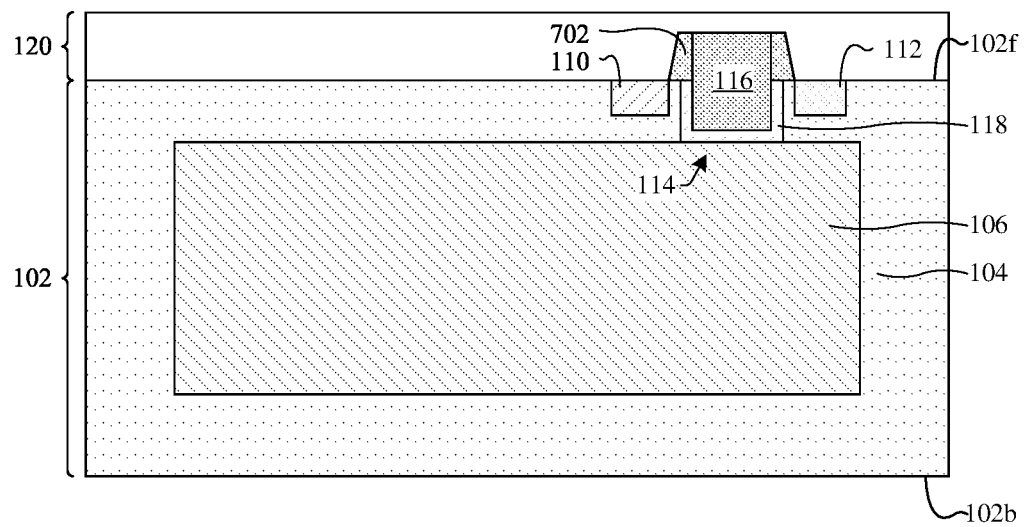

As shown in FIG. 17, a first ILD structure 120 is formed over the first semiconductor substrate 102 and the transfer gate 114. In some embodiments, the first ILD structure 120 may be formed with a substantially planar upper surface. In further embodiments, a process for forming the first ILD structure 120 comprises depositing an ILD layer on the first semiconductor substrate 102 and covering the transfer gate 114. The ILD layer may be deposited by CVD, PVD, sputtering, or some other deposition process. Thereafter, a planarization process (e.g., CMP) may be performed on the ILD layer.

Figure 18:
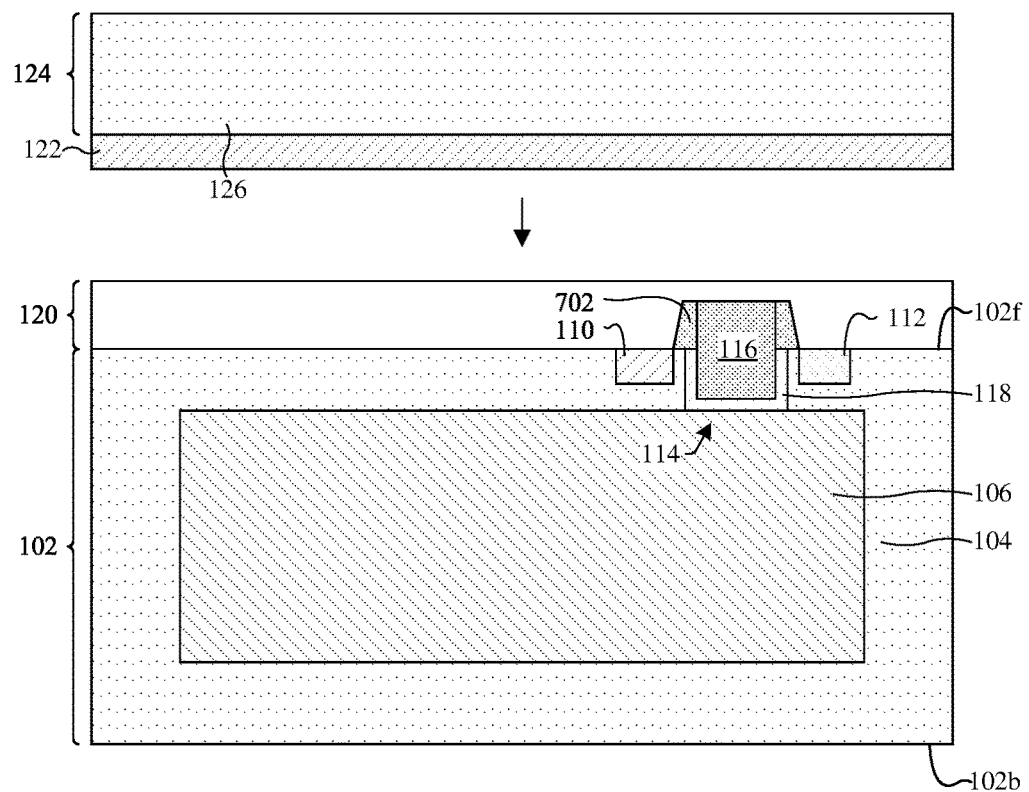

As shown in FIG. 18, a second semiconductor substrate 124 comprising an active region 126 is provided and bonded to the first semiconductor substrate 102. A bonding structure 122 is disposed on the second semiconductor substrate 124. In some embodiments, the bonding structure 122 may comprise, for example, an oxide (e.g., $SiO_2$), a nitride (e.g., SiN), an oxy-nitride (e.g., $SiO_XN_Y$), or the like. In further embodiments, a process for bonding the second semiconductor substrate 124 to the first semiconductor substrate 102 comprises positioning the second semiconductor substrate 124 so that the bonding structure 122 faces the first ILD structure 120. Thereafter, the bonding structure 122 is directly bonded to the first ILD structure 120 (e.g., via a direct bonding process).

Figure 19:
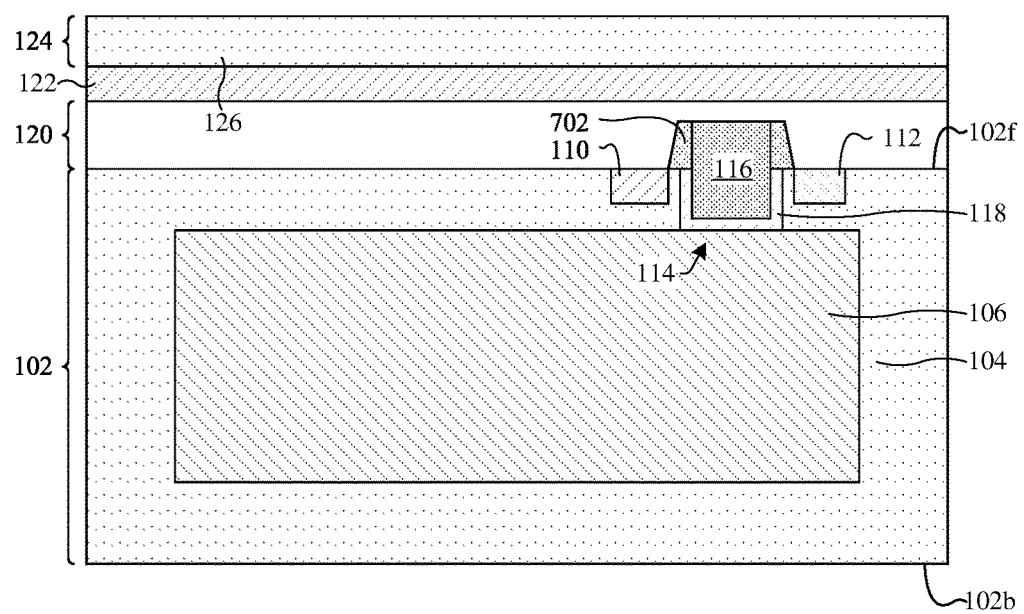

As shown in FIG. 19, the second semiconductor substrate 124 is thinned. In some embodiments, the second semiconductor substrate 124 may be thinned so that a thickness of the second semiconductor substrate 124 is less than a thickness of the first semiconductor substrate 102. In further embodiments, the second semiconductor substrate 124 may be thinned to a thickness less than about 100 micrometers (um), less than about 10 um, less than about 1 um, or less than about 100 nm. In yet further embodiments, the second semiconductor substrate 124 may be thinned by, for example, grinding, CMP, or some other thinning process. It will be appreciated that, in embodiments in which the active region is doped (e.g., having the first doping type), the active region 126 may be formed before or after the second semiconductor substrate 124 is bonded to the first semiconductor substrate 102 (e.g., via an ion implantation process).

Figure 20:
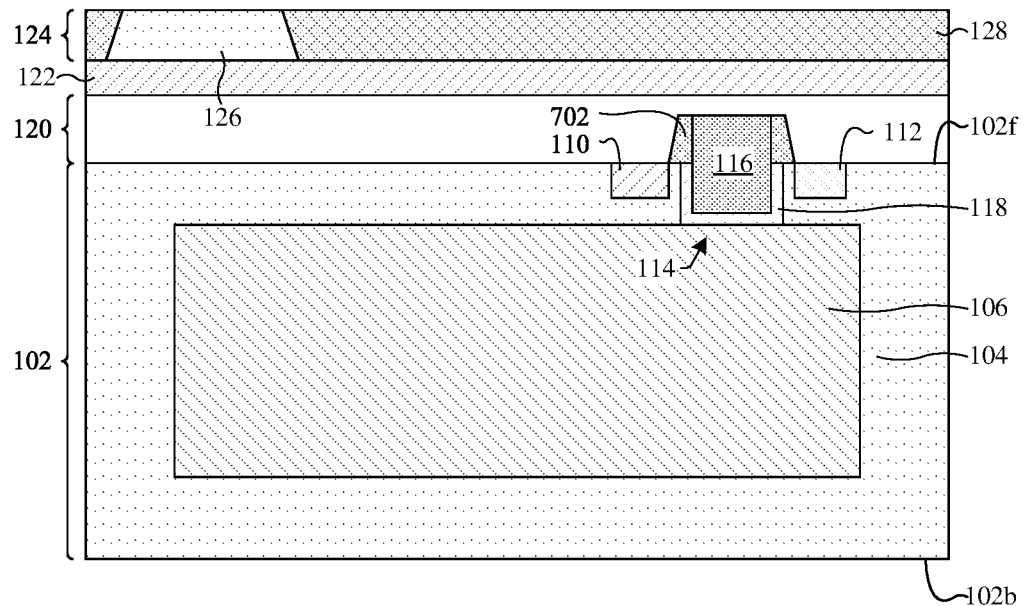

As shown in FIG. 20, a second isolation structure 128 is formed in the second semiconductor substrate 124. In some embodiments, the second isolation structure 128 may be formed by selectively etching the second semiconductor substrate 124 to form an isolation structure opening in the second semiconductor substrate 124, and subsequently filing the isolation structure opening with a dielectric material. In further embodiments, the second semiconductor substrate 124 is selectively etched by forming a masking layer (not shown) on the second semiconductor substrate 124, and subsequently exposing the second semiconductor substrate 124 to an etchant configured to selectively remove unmasked portions of the second semiconductor substrate 124. In yet further embodiments, the dielectric material may comprise an oxide (e.g., $SiO_2$), a nitride, a carbide, or the like.

Figure 21:
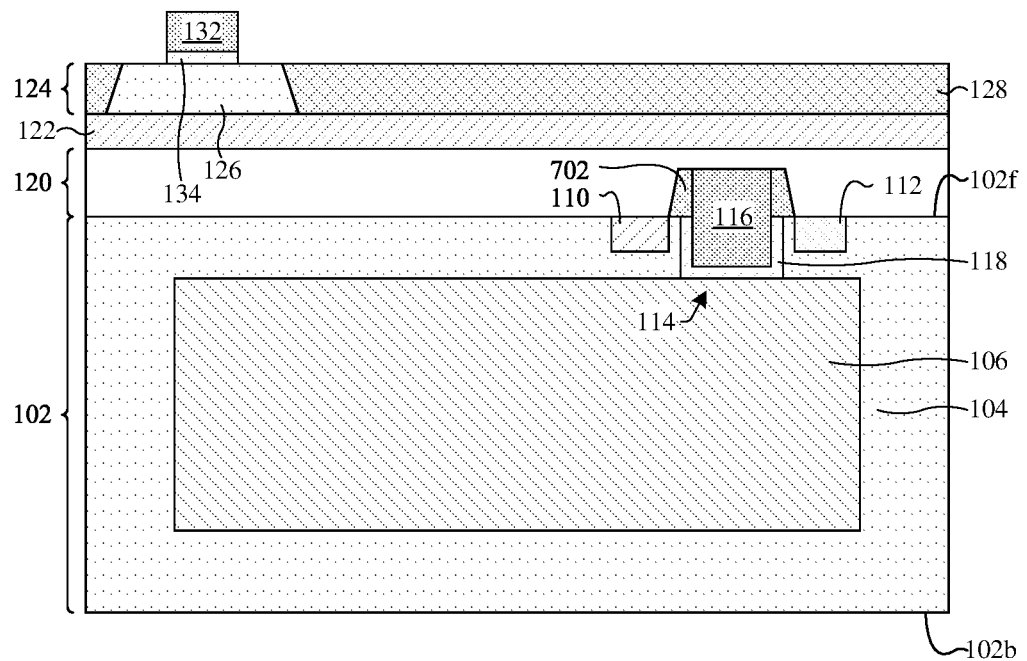

As shown in FIG. 21, a readout gate dielectric 134 and a readout gate electrode 132 are formed over the second semiconductor substrate 124. In some embodiments, a process for forming the readout gate dielectric 134 and the readout gate electrode 132 comprises depositing and/or growing (e.g., by CVD, PVD, ALD, thermal oxidation, sputtering, etc.) a readout gate dielectric layer (not shown) on the second semiconductor substrate 124. Thereafter, a readout gate electrode layer (not shown) may be deposited (e.g., by CVD, PVD, ALD, sputtering, electrochemical plating, electroless plating, etc.) on the readout gate dielectric layer. Subsequently, the readout gate dielectric layer and the readout gate electrode layer are selectively etched by utilizing a masking layer (not shown) on the readout gate electrode layer, thereby forming the readout gate dielectric 134 and the readout gate electrode 132, respectively. Subsequently, in some embodiments, the masking layer is stripped away.

Figure 22:
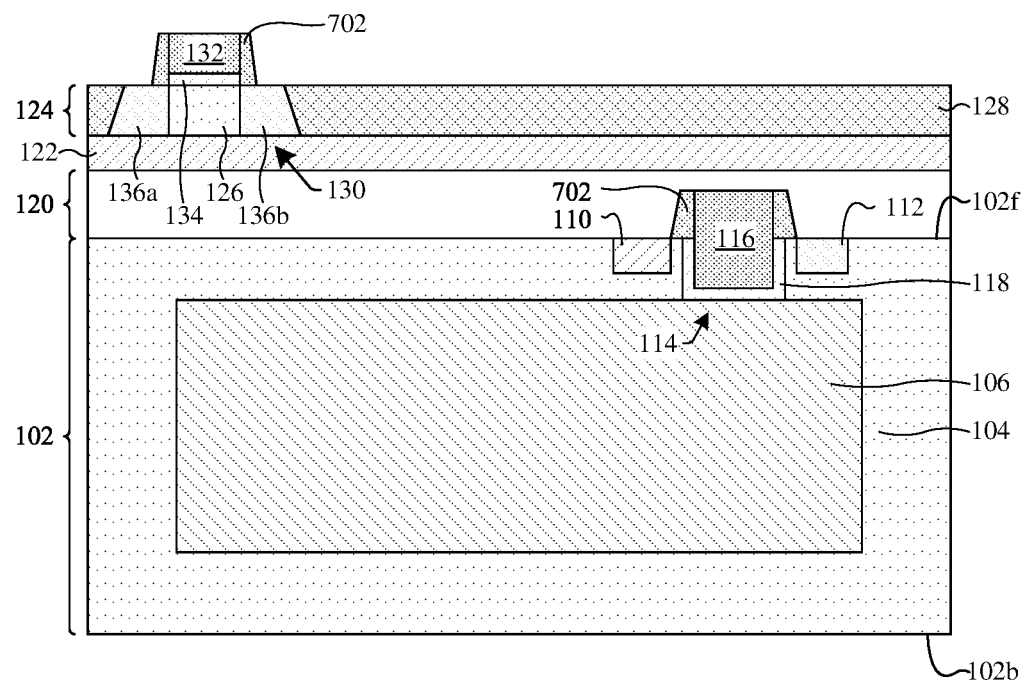

As shown in FIG. 22, a second sidewall spacer of the plurality of sidewall spacers 702 is formed over the second semiconductor substrate 124 and along sides of the readout gate electrode 132 and the readout gate dielectric 134. Further, a first pair of source/drain regions 136a-b are formed in the second semiconductor substrate 124. The first pair of source/drain regions 136a-b are portions of the second semiconductor substrate 124 having the first doping type or the second doping type. In some embodiments, the first pair of source/drain regions 136a-b have an opposite doping type than the active region 126.

In some embodiments, the second sidewall spacer may be formed by depositing a second spacer layer (not shown) over the second semiconductor substrate 124 and covering the readout gate electrode 132 and the readout gate dielectric 134. In further embodiments, the second spacer layer may be deposited by PVD, CVD, ALD, sputtering, or the like. The second spacer layer is subsequently etched to remove the second spacer layer from horizontal surfaces, leaving the second spacer layer along opposing sides of the readout gate electrode 132 and opposing sides of the readout gate dielectric 134, as the second sidewall spacer. In various embodiments, the second spacer layer may comprise, for example, a nitride (e.g., SiN), an oxy-nitride (e.g., $SiO_XN_Y$), or the like In some embodiments, the first pair of source/drain regions 136a-b may be formed by a selective implant process (e.g., a selective ion implantation process) that utilizes a masking layer (not shown) on the second semiconductor substrate 124 to selectively implant second doping type dopants (or first doping type dopants) into the second semiconductor substrate 124. Subsequently, in some embodiments, the masking layer is stripped away. In further embodiments, the readout gate electrode 132 may be utilized as the masking layer (e.g., self-aligned gate process). In yet further embodiments, after the first pair of source/drain regions 136a-b are formed, formation of a readout transistor 130 may be complete.

Figure 23:
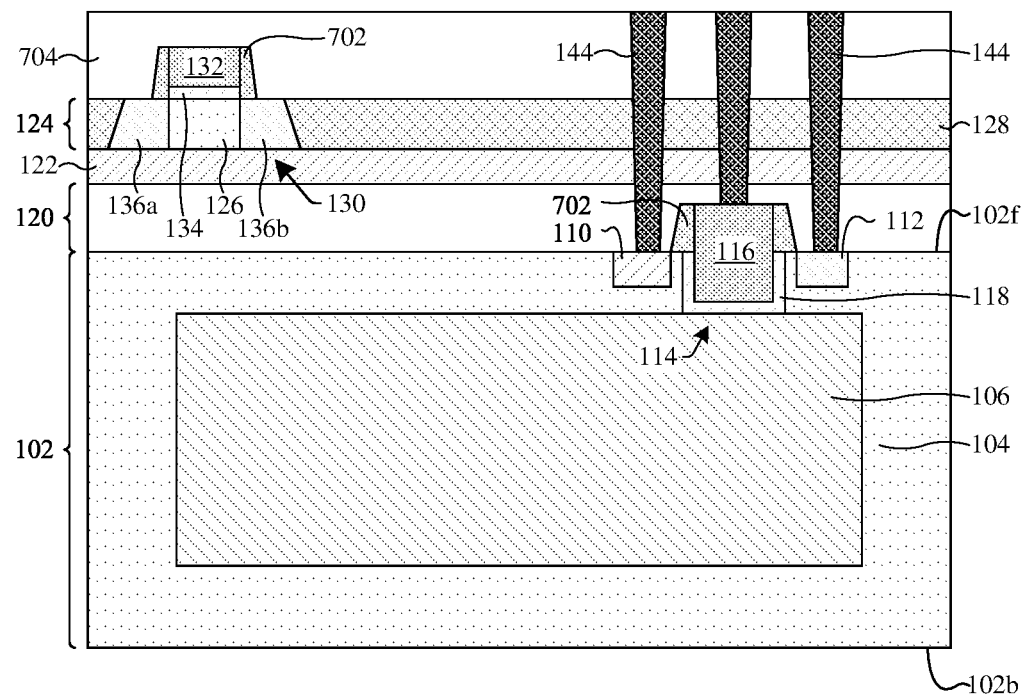

As shown in FIG. 23, a lower ILD structure 704 is formed over the second semiconductor substrate 124 and over the readout transistor 130. In some embodiments, the lower ILD structure 704 may be formed with a substantially planar upper surface. In further embodiments, a process for forming the lower ILD structure 704 comprises depositing an ILD layer on the second semiconductor substrate 124 and covering the readout transistor 130. The ILD layer may be deposited by CVD, PVD, sputtering, or some other deposition process. Thereafter, a planarization process (e.g., CMP) may be performed on the ILD layer.

Also shown in FIG. 23, a plurality of second conductive contacts 144 are formed extending through the lower ILD structure 704, the second semiconductor substrate 124, the bonding structure 122, and the first ILD structure 120. The second conductive contacts 144 are formed extending vertically from the pickup well contact region 110, the transfer gate electrode 116, and the floating diffusion node 112, respectively. In some embodiments, a process for forming the second conductive contacts 144 comprises forming a plurality of first conductive contact openings that correspond to the second conductive contacts 144, respectively. The first conductive contact openings extend through the lower ILD structure 704, the second semiconductor substrate 124, the bonding structure 122, and the first ILD structure 120. The first conductive contact openings may be formed by a selective etch process that utilizes a masking layer (not shown) on the lower ILD structure 704 to selectively expose the lower ILD structure 704, the second semiconductor substrate 124, the bonding structure 122, and the first ILD structure 120 to an etchant that removes unmasked portions of the lower ILD structure 704, the second semiconductor substrate 124, the bonding structure 122, and the first ILD structure 120. Subsequently, in some embodiments, the masking layer is stripped away.

Thereafter, a conductive material (e.g., W) is deposited on the lower ILD structure 704 and filling the first conductive contact openings. Subsequently, a planarization process (e.g., CMP) is performed into the conductive material, thereby forming the second conductive contacts 144. In some embodiments, the conductive material may be deposited by CVD, PVD, ALD, sputtering, electrochemical plating, electroless plating, some other deposition process, or a combination of the foregoing.

Figure 24:
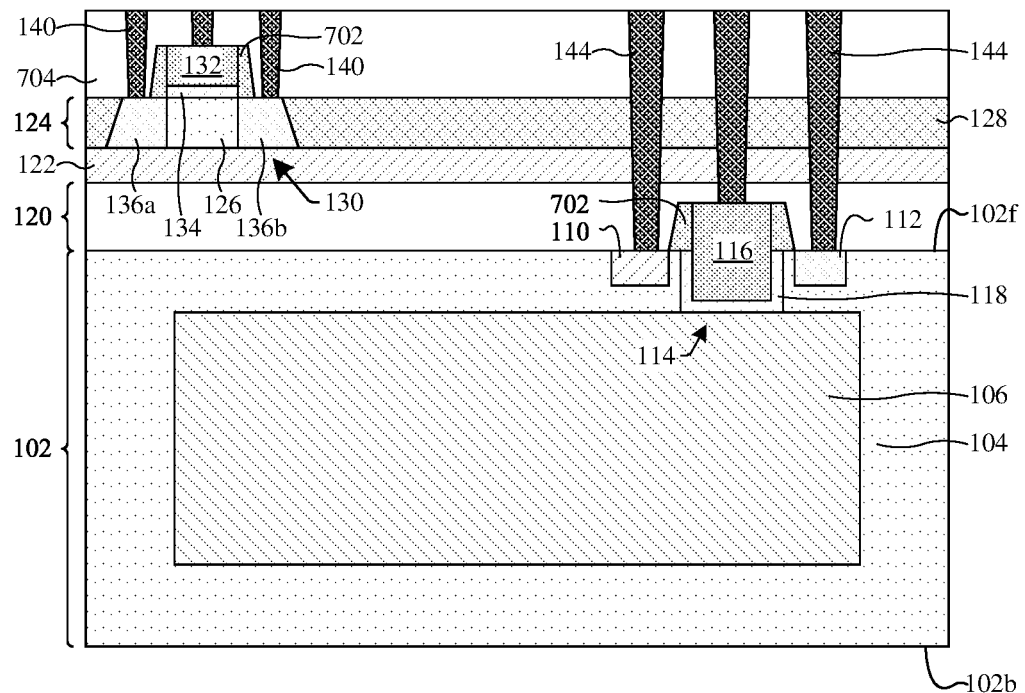

As shown in FIG. 24, a plurality of first conductive contacts 140 are formed extending through the lower ILD structure 704. The first conductive contacts 140 are formed extending vertically from the source/drain regions of the pair of source/drain regions 136a-b and the readout gate electrode 132, respectively. In some embodiments, a process for forming the first conductive contacts 140 comprises forming a plurality of second conductive contact openings extending through the lower ILD structure 704 to the source/drain regions of the first pair of source/drain regions 136a-b and the readout gate electrode 132, respectively. The second conductive contact openings may be formed by a selective etch process that utilizes a masking layer (not shown) on the lower ILD structure 704 to selectively expose the lower ILD structure 704 to an etchant that removes unmasked portions of the lower ILD structure 704. Subsequently, in some embodiments, the masking layer is stripped away.

Thereafter, a conductive material (e.g., W) is deposited on the lower ILD structure 704 and filling the second conductive contact openings. Subsequently, a planarization process (e.g., CMP) is performed into the conductive material, thereby forming the first conductive contacts 140. In some embodiments, the conductive material may be deposited by CVD, PVD, ALD, sputtering, electrochemical plating, electroless plating, some other deposition process, or a combination of the foregoing.

Figure 25:
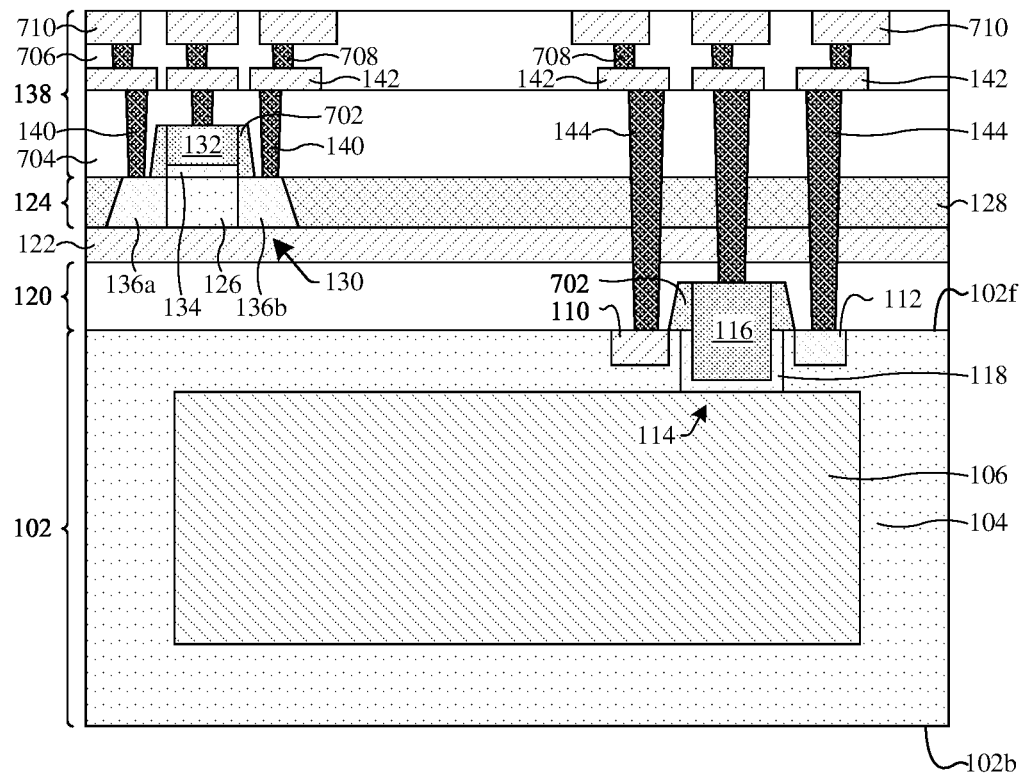

As shown in FIG. 25, an upper ILD structure 706, a plurality of first conductive lines 142, a plurality of first conductive vias 708, and a plurality of first contact pads 710 are formed over the lower ILD structure 704, the first conductive contacts 140, and the second conductive contacts 144. The upper ILD structure 706 may be formed with a substantially planar upper surface. In some embodiments, a process for forming the upper ILD structure 706 comprises depositing a plurality of ILD layers, which are stacked on one another, over the lower ILD structure 704, the first conductive contacts 140, and the second conductive contacts 144. The ILD layers may be deposited by CVD, PVD, sputtering, some other deposition process, or a combination of the foregoing. In further embodiments, a planarization process (e.g., CMP) may be performed on one or more of the plurality of ILD layers.

In some embodiments, a process for forming the first conductive lines 142, the first conductive vias 708, and the first contact pads 710 comprises forming a first ILD layer over the lower ILD structure 704, the first conductive contacts 140, and the second conductive contacts 144. The first ILD layer is selectively etched to form a first set of conductive line openings (not shown) that correspond to a first set of the first conductive lines 142. A conductive material (e.g., Cu) is deposited on the first ILD layer and filling the first set of conductive line openings. A planarization process (e.g., CMP) is performed into the conductive material, thereby forming the first set of the first conductive lines 142.

Thereafter, a second ILD layer is formed over the first set of conductive lines and the first ILD layer. The second ILD layer is selectively etched to form a first set of conductive via openings (not shown) that correspond to a first set of the first conductive vias 708. A conductive material (e.g., Cu) is deposited on the second ILD layer and filling the first set of conductive via openings. A planarization process (e.g., CMP) is performed into the conductive material, thereby forming the first set of the first conductive vias 708. This process (e.g., alternating formation of conductive lines and vias) is repeated until the first conductive lines 142 and the first conductive vias 708 are formed.

Thereafter, a third ILD layer is formed over the first conductive lines 142, the first ILD layer, the first conductive vias 708, and the second ILD layer. The third ILD layer is selectively etched to form a plurality of contact pad openings (not shown) that correspond to the first contact pads 710, respectively. A conductive material (e.g., Cu, Au, etc.) is deposited on the third ILD layer and filling the contact pad openings. A planarization process (e.g., CMP) is performed into the conductive material, thereby forming the first contact pads 710. In yet further embodiments, after the upper ILD structure 706 is formed, formation of a second ILD structure 138 may be complete.

Figure 26:
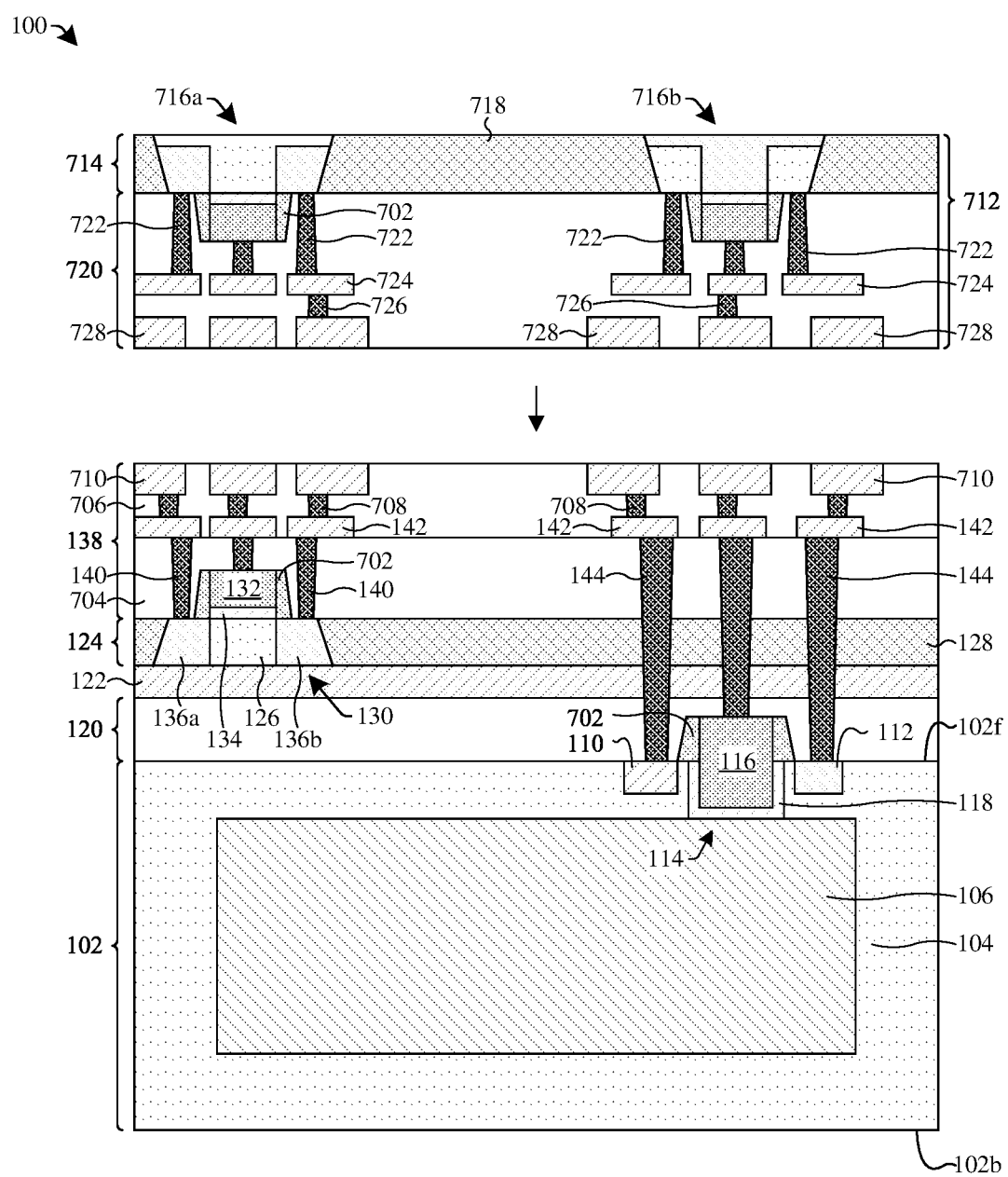

As shown in FIG. 26, an integrated chip (IC) 712 is bonded to the bonded together first and second semiconductor substrates. In some embodiments, the IC 712 comprises a third semiconductor substrate 714, a plurality of semiconductor devices 716a-b, a third isolation structure 718, a third ILD structure 720, a plurality of third conductive contacts 722, a plurality of second conductive lines 724, a plurality of second conductive vias 726, and a plurality of second contact pads 728. In further embodiments, a process for bonding the IC 712 to the bonded together first and second semiconductor substrates comprises positioning the IC 712 so that the second contact pads 728 are substantially aligned with and face the first contact pads 710, respectively. Thereafter, the first contact pads 710 are directly bonded to the second contact pads 728, respectively (e.g., via a hybrid bonding process, a direct bonding process, etc.).

Figure 27:
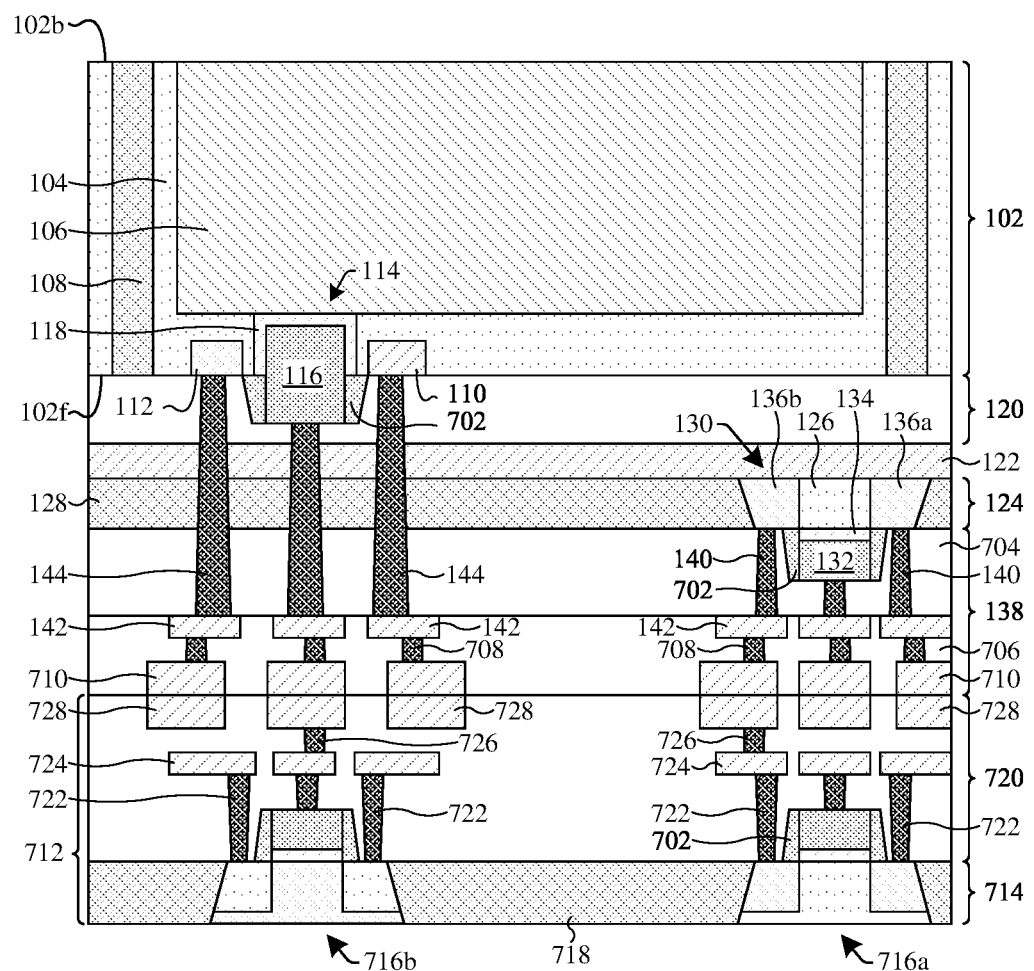

As shown in FIG. 27, a first isolation structure 108 is formed in the first semiconductor substrate 102. Further, in some embodiments, the first semiconductor substrate 102 may be thinned (e.g., via grinding, CMP, or the like). In some embodiments, the first semiconductor substrate 102 may be thinned before the first isolation structure 108 is formed in the first semiconductor substrate 102.

In some embodiments, a process for forming the first isolation structure 108 comprises selectively etching the first semiconductor substrate 102 to form an isolation structure opening in the first semiconductor substrate 102 that extends into the first semiconductor substrate 102 from the back-side 102b of the first semiconductor substrate 102, and subsequently filling the isolation structure opening (e.g., by CVD, PVD, ALD, thermal oxidation, sputtering, etc.) with a dielectric material. In further embodiments, the first semiconductor substrate 102 is selectively etched by forming a masking layer (not shown) on the back-side 102b of the first semiconductor substrate 102, and subsequently exposing the first semiconductor substrate 102 to an etchant configured to selectively remove unmasked portions of the first semiconductor substrate 102. In further embodiments, the dielectric material may comprise an oxide (e.g., $SiO_2$), a nitride, a carbide, or the like. In yet further embodiments, a planarization process (e.g., CMP) may be performed into the dielectric material and the first semiconductor substrate 102 to form a substantially planar surface.

Figure 28:
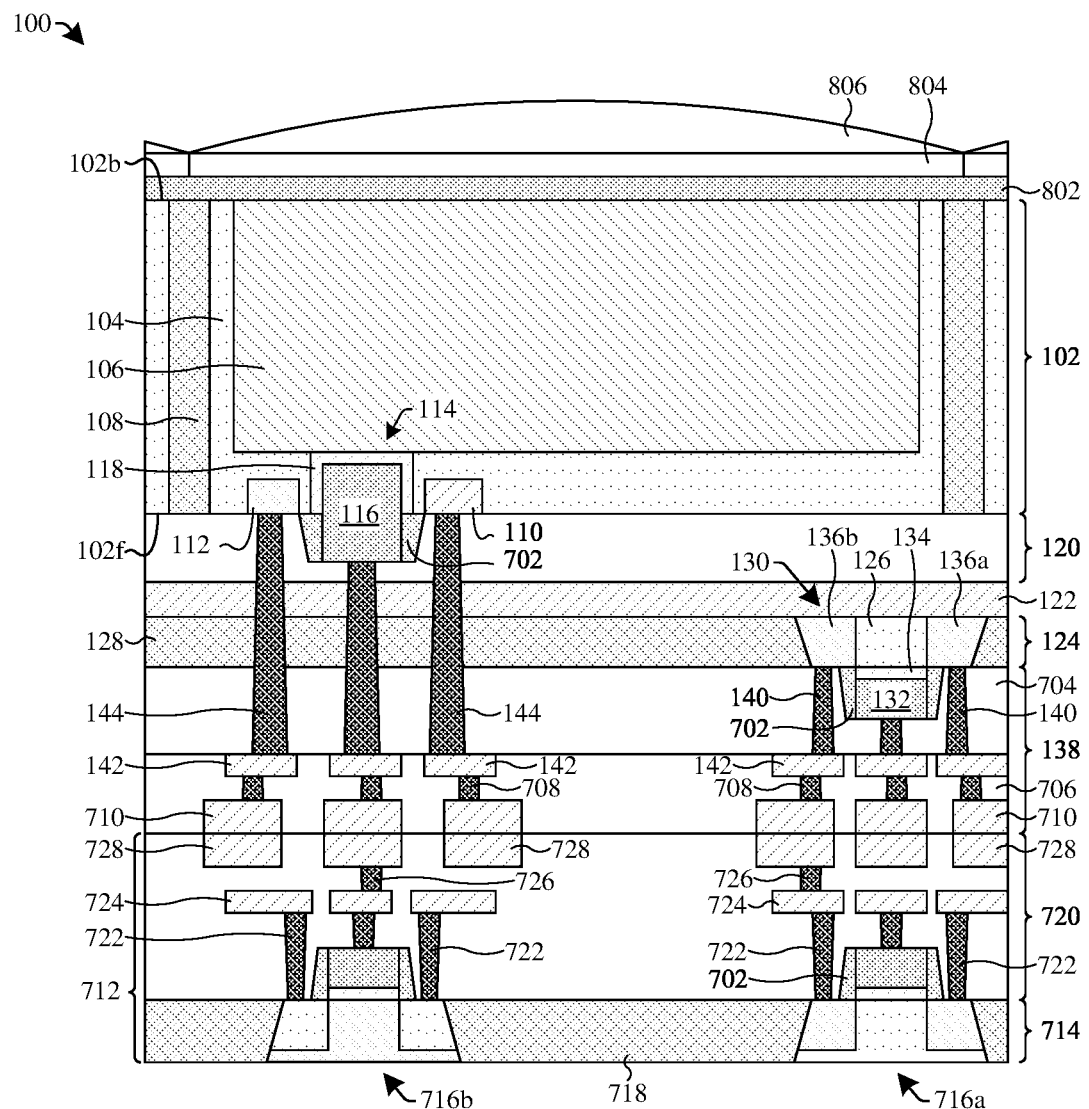

As shown in FIG. 28, an anti-reflection layer 802 is formed on the back-side 102b of the first semiconductor substrate 102. In some embodiments, the anti-reflection layer 802 is formed on the first doped region 104, the photodetector 106, and the first isolation structure 108. In some embodiments, the anti-reflection layer 802 may be formed by CVD, PVD, ALD, sputtering, or the like. Subsequently, in some embodiments, a planarization process (e.g., CMP) may be performed on the anti-reflection layer 802 to planarize an upper surface of the anti-reflection layer 802.

Also shown in FIG. 28, a plurality of light filters 804 (e.g., an infrared light filter, a red color filter, a blue color filter, a green color filter, etc.) are formed on the anti-reflection layer 802. In some embodiments, a center point of one of the light filters 804 is substantially aligned in a vertical direction with a center point of the photodetector 106. In further embodiments, the light filters 804 may be formed by forming various light filter layers over the anti-reflection layer 802 and selectively etching the various light filter layers in a predefined pattern. The light filter layers are formed of a material that allows for the transmission of radiation (e.g., light) having a specific wavelength range, while blocking light of wavelengths outside of the specified range. Subsequently, in some embodiments, a planarization process (e.g., CMP) may be performed on the light filter layers to planarize upper surfaces of the light filter layers.

Also shown in FIG. 28, a plurality of micro-lenses 806 are formed over the light filters 804, respectively. In some embodiments, center points of the micro-lenses 806 are substantially aligned in a vertical direction with center points of the light filters 804, respectively. In further embodiments, the micro-lenses 806 may be formed by depositing a micro-lens material on the light filters 804 (e.g., by a spin-on process, or some other deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed, and baked to form a rounding shape. The micro-lenses 806 are then formed by selectively etching the micro-lens material according to the micro-lens template. In further embodiments, after the micro-lenses 806 are formed, formation of the low-noise image sensor 100 is complete.

Figure 29:
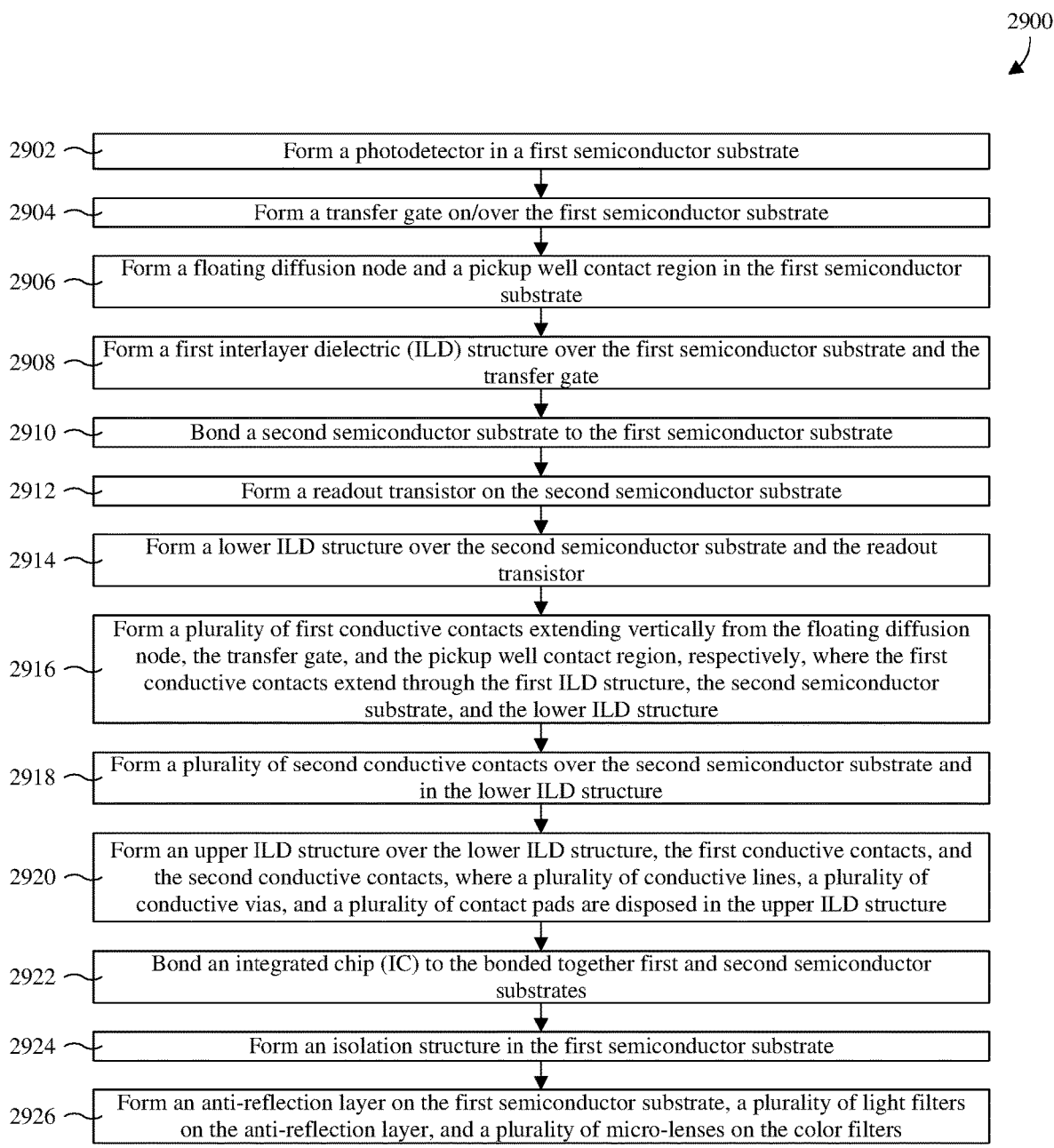
FIG. 29 illustrates a flowchart of some embodiments of a method for forming a low-noise image sensor having stacked semiconductor substrates.

FIG. 29 illustrates a flowchart 2900 of some embodiments of a method for forming a low-noise image sensor having stacked semiconductor substrates. While the flowchart 2900 of FIG. 29 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2902, a photodetector is formed in a first semiconductor substrate. FIG. 14 illustrates a cross-sectional view of some embodiments corresponding to act 2902.

At act 2904, a transfer gate is formed on/over the first semiconductor substrate. FIG. 15 illustrates a cross-sectional view of some embodiments corresponding to act 2904.

At act 2906, a floating diffusion node and a pickup well contact region are formed in the first semiconductor substrate. FIG. 16 illustrates a cross-sectional view of some embodiments corresponding to act 2906.

At act 2908, a first interlayer dielectric (ILD) structure is formed over the first semiconductor substrate and the transfer gate. FIG. 17 illustrates a cross-sectional view of some embodiments corresponding to act 2908.

At act 2910, a second semiconductor substrate is bonded to the first semiconductor substrate. FIG. 18 illustrates a cross-sectional view of some embodiments corresponding to act 2910.

At act 2912, a readout transistor is formed on the second semiconductor substrate. FIGS. 18-21 illustrate a series of cross-sectional views of some embodiments corresponding to act 2912.

At act 2914, a lower ILD structure is formed over the second semiconductor substrate and the readout transistor. FIG. 23 illustrates a cross-sectional view of some embodiments corresponding to act 2914.

At act 2916, a plurality of first conductive contacts are formed extending vertically from the floating diffusion node, the transfer gate, and the pickup well contact, respectively, wherein the first conductive contacts extend through the first ILD structure, the second semiconductor substrate, and the lower ILD structure. FIG. 23 illustrates a cross-sectional view of some embodiments corresponding to act 2916.

At act 2918, a plurality of second conductive contacts are formed over the second semiconductor substrate and in the lower ILD structure. FIG. 24 illustrates a cross-sectional view of some embodiments corresponding to act 2918.

At act 2920, an upper ILD structure is formed over the lower ILD structure, the first conductive contacts, and the second conductive contacts, where a plurality of conductive lines, a plurality of conductive vias, and a plurality of contact pads are disposed in the upper ILD structure. FIG. 25 illustrates a cross-sectional view of some embodiments corresponding to act 2920.

At act 2922, an integrated chip (IC) is bonded to the bonded together first and second semiconductor substrates. FIG. 26 illustrates a cross-sectional view of some embodiments corresponding to act 2922.

At act 2924, an isolation structure is formed in the first semiconductor substrate. FIG. 27 illustrates a cross-sectional view of some embodiments corresponding to act 2924.

At act 2926, an anti-reflection layer is formed on the first semiconductor substrate, a plurality of light filters are formed on the anti-reflection layer, and a plurality of microlenses are formed on the light filters. FIG. 28 illustrates a cross-sectional view of some embodiments corresponding to act 2926.

In some embodiments, the present application provides an image sensor. The image sensor comprises a first semiconductor substrate comprising a photodetector and a floating diffusion node. A transfer gate is disposed over the first semiconductor substrate, where the transfer gate is at least partially disposed between opposite sides of the photodetector. A second semiconductor substrate is vertically spaced from the first semiconductor substrate, where the second semiconductor substrate comprises a first surface and a second surface opposite the first surface. A readout transistor is disposed on the second semiconductor substrate, where the second surface is disposed between the transfer gate and a gate of the readout transistor. A first conductive contact is electrically coupled to the transfer gate and extending vertically from the transfer gate through both the first surface and the second surface.

In some embodiments, the present application provides an image sensor. The image sensor comprises a plurality of photodetectors disposed in a first semiconductor substrate, where the photodetectors are disposed in an array. A first isolation structure is disposed in the first semiconductor substrate, where the first isolation structure laterally surrounds each of the photodetectors. A second semiconductor substrate is vertically spaced from the first semiconductor substrate and the first isolation structure, where the second semiconductor substrate comprises a first surface and a second surface opposite the first surface. A plurality of floating diffusion nodes are disposed in the first semiconductor substrate, where the floating diffusion nodes are disposed between the second semiconductor substrate and the photodetectors, respectively. A plurality of first conductive contacts are electrically coupled to the floating diffusion nodes, respectively, where the first conductive contacts extend vertically between the second semiconductor substrate and the floating diffusion nodes, respectively. A first readout transistor is disposed on the second semiconductor substrate and at least partially between the first conductive contacts, where the second surface is disposed between the first semiconductor substrate and a first gate of the first readout transistor.

In some embodiments, the present application provides a method for forming an image sensor. The method comprises forming a photodetector in a first semiconductor substrate. A transfer gate is formed over the first semiconductor substrate. A floating diffusion node is formed in the first semiconductor substrate. A first interlayer dielectric (ILD) structure is formed over the first semiconductor substrate and the transfer gate. A bonding layer disposed on a second semiconductor substrate is bonded to the first ILD structure. A readout transistor is formed on the second semiconductor substrate and over the first semiconductor substrate. A second ILD structure is formed over the second semiconductor and the readout transistor. An integrated chip (IC) is bonded to the bonded together first and second semiconductor substrates, where the IC comprises an image processing device, and where both the first ILD structure and the second ILD structure are between the transfer gate and the image processing device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:

forming a plurality of photodetectors in a first semiconductor substrate;
forming a plurality of floating diffusion nodes in the first semiconductor substrate, wherein the plurality of floating diffusion nodes respectively correspond to the plurality of photodetectors;
forming a first interlayer dielectric (ILD) structure over the first semiconductor substrate;
bonding a second semiconductor substrate to the first semiconductor substrate, such that the first ILD structure is disposed vertically between the second semiconductor substrate and the first semiconductor substrate;
forming a first isolation structure in the second semiconductor substrate;
forming a gate electrode of a readout transistor over the second semiconductor substrate, the first ILD structure, and the first semiconductor substrate;
forming a pair of source/drain (S/D) regions of the readout transistor in the second semiconductor substrate, wherein the S/D regions of the pair of S/D regions are formed on opposite sides of the gate electrode;
after the first isolation structure is formed, forming a second ILD structure over the first isolation structure, the second semiconductor substrate, the gate electrode, the first ILD structure, and the first semiconductor substrate;
forming a plurality of floating diffusion node contacts (FDNCs) overlying the plurality of floating diffusion nodes, respectively, wherein the plurality of FDNCs are formed extending vertically from the plurality of floating diffusion nodes, respectively, and wherein the plurality of FDNCs are formed in the second ILD structure, the first isolation structure, and the first ILD structure;
forming a S/D contact overlying a first S/D region of the pair of S/D regions, wherein the S/D contact is formed extending vertically from the first S/D region, and wherein the S/D contact is formed in the second ILD structure;
forming a third ILD structure over the second ILD structure, the plurality of FDNCs, and the S/D contact; and
forming a conductive line in the third ILD structure, wherein the conductive line is formed overlying the plurality of FDNCs and overlying the S/D contact, and wherein the conductive line is formed electrically coupled to the plurality of FDNCs and electrically coupled to the S/D contact.

2. The method of claim 1, wherein forming the conductive line comprises:
forming a conductive line trench in the third ILD structure, wherein the conductive line trench exposes the plurality of FDNCs and exposes the S/D contact; and
depositing a conductive material in the conductive line trench.

3. The method of claim 1, wherein the gate electrode of the readout transistor is formed after the first isolation structure is formed.

4. The method of claim 1, wherein the pair of S/D regions of the readout transistor is formed after the first isolation structure is formed.

5. The method of claim 1, wherein the first isolation structure is formed with an upper surface that is substantially planar with an upper surface of the second semiconductor substrate.

6. The method of claim 1, wherein the second ILD structure is formed after the first isolation structure, the gate electrode of the readout transistor, and the pair of S/D regions of the readout transistor are formed.

7. The method of claim 1, wherein:
forming the plurality of FDNCs comprises depositing a first conductive material via a first deposition process;
forming the S/D contact comprises depositing a second conductive material via a second deposition process; and
the second deposition process is different than the first deposition process.

8. The method of claim 1, wherein bonding the second semiconductor substrate to the first semiconductor substrate comprises bonding a bonding layer disposed on the second semiconductor substrate to the first ILD structure.

9. The method of claim 8, wherein forming the first isolation structure comprises forming a trench in the second semiconductor substrate that exposes the bonding layer.

10. The method of claim 9, wherein:
the plurality of FDNCs are formed in the bonding layer; and
the S/D contact is formed in the bonding layer.

11. A method for forming an image sensor, the method comprising:
forming a first photodetector, a second photodetector, a third photodetector, and a fourth photodetector in a first semiconductor substrate;
forming a first floating diffusion node, a second floating diffusion node, a third floating diffusion node, and a fourth floating diffusion node in the first semiconductor substrate, wherein the first, second, third, and fourth floating diffusion nodes respectively correspond to the first, second, third, and fourth photodetectors;
depositing a first interlayer dielectric (ILD) layer over the first semiconductor substrate;
bonding a second semiconductor substrate to the first semiconductor substrate, such that the first ILD layer is disposed vertically between the second semiconductor substrate and the first semiconductor substrate;
forming a first isolation structure in the second semiconductor substrate;
forming a gate electrode of a readout transistor over the second semiconductor substrate;
forming a pair of source/drain (S/D) regions of the readout transistor in the second semiconductor substrate, wherein the S/D regions of the pair of S/D regions are formed on opposite sides of the gate electrode;
forming a second ILD layer over the first isolation structure, the second semiconductor substrate, and the gate electrode;
forming a first conductive contact in the second ILD layer, the first isolation structure, and the first ILD layer, wherein the first conductive contact is formed overlying and extending vertically from the first floating diffusion node;
forming a second conductive contact in the second ILD layer, the first isolation structure, and the first ILD layer, wherein the second conductive contact is formed overlying and extending vertically from the second floating diffusion node;
forming a third conductive contact in the second ILD layer, the first isolation structure, and the first ILD layer, wherein the third conductive contact is formed overlying and extending vertically from the third floating diffusion node;

forming a fourth conductive contact in the second ILD layer, the first isolation structure, and the first ILD layer, wherein the fourth conductive contact is formed overlying and extending vertically from the fourth floating diffusion node;

forming a fifth conductive contact in the second ILD layer, wherein the fifth conductive contact is formed overlying and extending vertically from a first S/D region of the pair of S/D regions;

depositing a third ILD layer over the first, second, third, fourth, and fifth conductive contacts and over the second ILD layer;

forming a conductive line trench in the third ILD layer, wherein the conductive line trench exposes the first, second, third, fourth, and fifth conductive contacts, and wherein the conductive line trench is formed extending laterally around at least three sidewalls of the gate electrode; and filling the conductive line trench with a conductive material, thereby forming a conductive line in the conductive line trench and that is electrically coupled to the first, second, third, fourth, and fifth conductive contacts.

12. The method of claim 11, wherein:
the first photodetector neighbors both the second photodetector and the third photodetector;
the second photodetector neighbors both the first photodetector and the fourth photodetector;
the third photodetector neighbors both the first photodetector and the fourth photodetector; and
the fourth photodetector neighbors both the second photodetector and the third photodetector.

13. The method of claim 12, further comprising:
forming a second isolation structure in the first semiconductor substrate and laterally surrounding the first, second, third, and fourth photodetectors, wherein the second isolation structure is formed with a first portion that extends laterally through the first semiconductor substrate in a first direction, wherein the second isolation structure is formed with a second portion that extends laterally through the first semiconductor substrate in a second direction perpendicular to the first direction, wherein the first portion of the second isolation structure intersects the second portion of the second isolation structure at an intersection portion of the second isolation structure, and wherein the second isolation structure is formed so that the intersection portion of the second isolation structure is disposed at least partially within a perimeter of the gate electrode of the readout transistor.

14. The method of claim 13, wherein the second isolation structure is formed so that:
the first photodetector and the second photodetector are disposed on a first side of the first portion of the second isolation structure;
the third photodetector and the fourth photodetector are disposed on a second side of the first portion of the second isolation structure opposite the first side of the first portion of the second isolation structure;
the first photodetector and the third photodetector are disposed on a first side of the second portion of the second isolation structure; and
the second photodetector and the fourth photodetector are disposed on a second side of the second portion of the second isolation structure opposite the first side of the second portion of the second isolation structure.

15. The method of claim 14, wherein the second isolation structure is formed so that:
the first conductive contact and the second conductive contact are disposed on the first side of the first portion of the second isolation structure;
the third conductive contact and the fourth conductive contact are disposed on the second side of the first portion of the second isolation structure;
the first conductive contact and the third conductive contact are disposed on the first side of the second portion of the second isolation structure; and
the second conductive contact and the fourth conductive contact are disposed on the second side of the second portion of the second isolation structure.

16. The method of claim 15, wherein the conductive line is formed so that:
the first conductive contact contacts the conductive line at a first location;
the second conductive contact contacts the conductive line at a second location;
the third conductive contact contacts the conductive line at a third location;
the fourth conductive contact contacts the conductive line at a fourth location;
the conductive line extends from the first location to the third location by extending laterally from the first side of the first portion of the second isolation structure to the second side of the first portion of the second isolation structure;
the conductive line extends from the third location to the fourth location by extending laterally from the first side of the second portion of the second isolation structure to the second side of the second portion of the second isolation structure; and
the conductive line extends from the fourth location to the second location by extending laterally from the second side of the first portion of the second isolation structure to the first side of the first portion of the second isolation structure.

17. The method of claim 16, wherein:
a first sidewall of the first portion of the second isolation structure defines the first side of the first portion of the second isolation structure;
a second sidewall of the first portion of the second isolation structure defines the second side of the first portion of the second isolation structure;
a first sidewall of the second portion of the second isolation structure defines the first side of the second portion of the second isolation structure;
a second sidewall of the second portion of the second isolation structure defines the second side of the second portion of the second isolation structure;
the conductive line is formed so that the fifth conductive contact contacts the conductive line at a fifth location; and
the fifth location is disposed, at least partially, between the first sidewall of the second portion of the second isolation structure and the second sidewall of the second portion of the second isolation structure.

18. A method for forming an image sensor, the method comprising:
forming a first photodetector, a second photodetector, a third photodetector, and a fourth photodetector in a first semiconductor substrate;
forming a first interlayer dielectric (ILD) structure over the first semiconductor substrate;

bonding a second semiconductor substrate to the first semiconductor substrate, such that the first ILD structure is disposed vertically between the second semiconductor substrate and the first semiconductor substrate;

forming a gate electrode of a readout transistor over the second semiconductor substrate, wherein the gate electrode is formed over a first portion of an active region of the second semiconductor substrate;

forming a pair of source/drain (S/D) regions of the readout transistor in the second semiconductor substrate, wherein the pair of S/D regions comprises a first S/D region and a second S/D region that are laterally spaced in a first direction, and wherein the first S/D region and the second S/D region are formed on opposite sides of the gate electrode;

forming a second ILD structure over the second semiconductor substrate and the gate electrode;

forming a first conductive contact in the second ILD structure, wherein the first conductive contact is formed overlying and extending vertically from the first S/D region;

forming a second conductive contact in the second ILD structure, wherein the second conductive contact is formed overlying and extending vertically from the second S/D region;

forming a third conductive contact in the second ILD structure, wherein the third conductive contact is formed overlying and extending vertically from a second portion of the active region of the second semiconductor substrate, wherein a third portion of the active region extends laterally from the first portion of the active region to the second portion of the active region in a second direction that is perpendicular to the first direction; and forming an isolation structure in the first semiconductor substrate and laterally surrounding the first, second, third, and fourth photodetectors, wherein the isolation structure is formed with a first portion that extends laterally through the first semiconductor substrate in the first direction, wherein the isolation structure is formed with a second portion that extends laterally through the first semiconductor substrate in the second direction, wherein the first portion of the isolation structure intersects the second portion of the isolation structure at an intersection portion of the isolation structure, wherein the isolation structure is formed so that the third conductive contact at least partially overlies the second portion of the isolation structure.

19. The method of claim 18, wherein:
the isolation structure is formed so that the third conductive contact is disposed, at least partially, between a first sidewall of the second portion of the isolation structure and a second sidewall of the second portion of the isolation structure; and
the first sidewall of the second portion of the isolation structure is opposite the second sidewall of the second portion of the isolation structure; and
the first sidewall of the second portion of the isolation structure is laterally spaced from the second sidewall of the second portion of the isolation structure in the first direction.

20. The method of claim 19, wherein:
the isolation structure is formed so that the first portion of the active region at least partially overlies the intersection portion of the isolation structure;
the isolation structure is formed so that the first conductive contact and the second conductive contact both at least partially overlie the first portion of the isolation structure.

* * * * *